United States Patent [19]
Weber et al.

[11] Patent Number: 6,096,087
[45] Date of Patent: *Aug. 1, 2000

[54] METHOD AND SYSTEM FOR VEHICLE DESIGN USING REFLECTION ZONES

[75] Inventors: William Francis Weber, Bloomfield Hills; Daniel Cornelius Bach, Jr., Belleville; Nicholas D. McGuire, Ypsilanti; Frederick Abraham Karam, Allen Park; Sean James Sevrence, Temperance; Scott Ming-Hua Tang; Michael Joseph Walraven, both of Ypsilanti; Mark Russell Henault, Milford, all of Mich.

[73] Assignee: Ford Global Technologies, Inc., Dearborn, Mich.

[ * ] Notice: This patent is subject to a terminal disclaimer.

[21] Appl. No.: 08/984,802

[22] Filed: Dec. 4, 1997

(Under 37 CFR 1.47)

[51] Int. Cl.$^7$ .............................. G06F 17/50; G06F 9/455
[52] U.S. Cl. .................................... 703/8; 703/1; 345/419
[58] Field of Search ........................ 395/500.01, 500.37, 395/500.29; 345/333, 348, 353, 356, 419 473, 339, 355; 364/148.01, 149, 150, 151, 152, 468.01, 468.02, 468.03, 468.04, 468.09, 468.1, 468.12; 180/271, 286, 287; 280/1; 434/29, 257, 267, 365, 370, 373; 382/104

[56] References Cited

U.S. PATENT DOCUMENTS

| | | | |
|---|---|---|---|
| 4,439,824 | 3/1984 | Mayer | 364/150 |
| 4,625,329 | 11/1986 | Ishikawa et al. | 382/104 |

(List continued on next page.)

FOREIGN PATENT DOCUMENTS

| | | |
|---|---|---|
| 0 401 900 A1 | 5/1990 | European Pat. Off. . |
| 2 240 414 | 12/1990 | United Kingdom . |

OTHER PUBLICATIONS

R.W. McLay et al., "Ergonomics, spinal injury, and industrial vehicle safety", Proceedings of the 1996 Fifteenth Southern Biomedical Engineering Conference, 1996, pp. 191–194.

(List continued on next page.)

Primary Examiner—Kevin J. Teska
Assistant Examiner—Russell W. Frejd
Attorney, Agent, or Firm—David B. Kelley

[57] ABSTRACT

A computer based system and method for designing an automotive vehicle orients an occupant representation, in electronic form, with respect to a three-dimensional electronic representation of a portion of the vehicle. At least one vehicle system is represented, also in electronic form, with respect to a common reference point, at least one human factors reflection study is electronically performed to determine occupant reflection reception with at least one vehicle system, and an outcome of that study is reported to a vehicle designer. The designer then has an option to vary, or alter, the occupant orientation, the location of the vehicle system, or both, so that the design meets a predetermined reflection criteria of the study. However, the designer may opt to retain the design despite non-compliance with the reflection criteria. If a parameter change is made, the system and method automatically rebuild every other effected dimension, and vehicle systems to satisfy the regenerated design are automatically selected from an electronic parts library so that packaging alternatives can be quickly studied. A geometric representation of vehicle system-to-occupant reflection may be displayed to allow a designer to visually assess compliance with a particular reflection criteria. The occupant representation, vehicle, vehicle system, and geometric representation of the occupant reflection reception may be rendered and animated in three-dimensions permitting views from various perspectives. The method and system can quickly provide accurate human factors reflection studies for a vehicle design while allowing system packaging flexibility.

63 Claims, 16 Drawing Sheets

(8 of 16 Drawing Sheet(s) Filed in Color)

U.S. PATENT DOCUMENTS

| | | | |
|---|---|---|---|
| 4,811,240 | 3/1989 | Ballou et al. | 345/334 |
| 4,912,657 | 3/1990 | Saxton | 345/356 |
| 5,033,014 | 7/1991 | Carver et al. | 703/1 |
| 5,070,534 | 12/1991 | Lascelles et al. | 345/348 |
| 5,111,413 | 5/1992 | Lazansky et al. | 703/16 |
| 5,189,626 | 2/1993 | Colburn | 700/182 |
| 5,197,120 | 3/1993 | Saxton et al. | 345/439 |
| 5,293,479 | 3/1994 | Quintero et al. | 345/353 |
| 5,481,465 | 1/1996 | Itoh | 700/118 |
| 5,590,268 | 12/1996 | Doi et al. | 345/326 |
| 5,729,463 | 3/1998 | Koenig et al. | 700/98 |
| 5,761,063 | 6/1998 | Jannette et al. | 364/468.03 |
| 5,799,293 | 8/1998 | Kaepp | 706/45 |
| 5,844,554 | 12/1998 | Geller et al. | 345/333 |

OTHER PUBLICATIONS

S. Aono, "The Next Step in Automotive Electronic Control", International Congress on Transportation Electronics, 1988, Convergence 88, pp. 83–89.

M. Asano et al., "New Approach in Automotive Control—An Experimental Variable–Response Vehicle", 1991 International Conference on Industrial Electronics, Control and Instrumentation 1991, IECON ''91, pp. 123–128.

P.A.J. Barham et al., "The Ergonomic and Safety Implications of In–Car ATT Devices—Evidence from Field Trials with Elderly Drivers", IEE Colloquium on Design of the Driver Interface, 1995, pp. 4/1–4/3.

A. Pauzie et al., "Ergonomic Evaluation of a Prototype Guidance System in an Urban Area. Discussion about methodologies and data collection tools", Vehicle Navigation and Information Systems Conference, 1995, In Conjunction with the Pacific Rim TransTech Conference, 6th International VNIS, pp. 390–396.

J.L. Campbell, "Development of Human Factors Design Guidelines for Advanced Traveler Information Systems (ATIS)", Vehicle Navigation and Information Systems Conference, 1995, In Conjunction with the Pacific Rim TransTech Conference, 6th International VNIS, pp. 161–164.

J. Laird Evans et al., "In–Vehicle Man–Machine Interaction–the SOCRATES approach", Vehicle Navigation anf Information Systems Conference 1994, pp. 473–477.

T.S. Abbott et al., "Functional Catagories for Human–Centered Flight Deck Design", Digital Avionics Systems Conference, 1993, 12th DASC, AIAA/IEEE, pp. 66–74.

E.J. Hartzell et al., "Computational Human Factors in Human–Machine Engineering—The Army–NASA Aircrew/Aircraft Integration (A/sup 3/I) Program", Proceedings of the IEEE 1988 National Aerospace and Electronics Conference, 1988 NAECON 1988, pp. 819–822.

INSPEC Acc. No. 1816358, SAMMIE: A Computer Aid for Man Machine Modelling, 8th Annual Conference on Computer Graphics and Interactive Techniques, Computer Graphics, Aug. 1981, vol. 15, No. 3, pp. 163–169.

F. Purschke et al., Virtual Reality—New Methods for Improving and Accelerating the Development Process in Vehicle Styling and Design, Computer Graphics International, 1998, pp. 789–797.

SAE J903c, Nov. 1973—"Passenger Car windshield Wiper Syhstems".

SAE J1052, May 1987—"Motor Vehicle Driver and Passenger Head Position".

SAE J100, Mar. 1988—"Passenger Car Glazing shade Bands".

SAE J287, Jun. 1988—"Driver Hand Control Reach".

SAE J1516, Mar. 1990—"Accommodation Tool Reference Point".

SAE J1517, Mar. 1990—"Driver Selected Seat Position".

SAE J1521, Mar. 1990—"Truck Driver Shin–Knee Position For Clutch and Accelerator".

SAE J1522, Mar. 1990—"Truck Driver Stomach Position".

SAE J826, Jun. 1992—"Devices for Use in Defining and Measuring Vehicle Seating Accommodation".

SAE J941, Jun. 1992—"Motor Vehicle Drivers' Eye Locations".

SAE J902, Apr. 1993—"Passenger Car Windshield Defrosting Systems".

SAE J198, Jun. 1993—"Windshield Wiper Systems—Trucks, Buses, and Multipurpose Vehicles".

SAE J1100, Jun. 1993—"Motor Vehicle Dimensions".

SAE J1050—"Describing and Measuring the Driver's Field of View.

"Automating Design in Pro/Engineer with Pro/Program", Mark Henault, Sean Sevrence and Mike Walraven (Onword Press) 1997.

Chrysler Puts Comfort in the Front Seat with/ Ilog Tools (S. Alexander) Internet Web Site http://www.infoworld.com/pageone/special/eccase042296.htm (Internet publication date unknown).

Inspec acc. No. 2832913, SAMMIE: a computer aided design tool for ergonomists, Proc. Human Factors Soc. 30th meeting, vol. 1, pp. 695–698, Dayton Ohio, Sep. 29–Oct. 3, 1986.

Inspec acc. No. 4408183, Use of ergonomic workspace modelling in vehicle design, CAES '92, pp. 145–152, 1992.

Techmath releases RAMSIS 3.4 Human–Modeling Software, at www.nasatech.com/NEWS/techmath_0119.html.

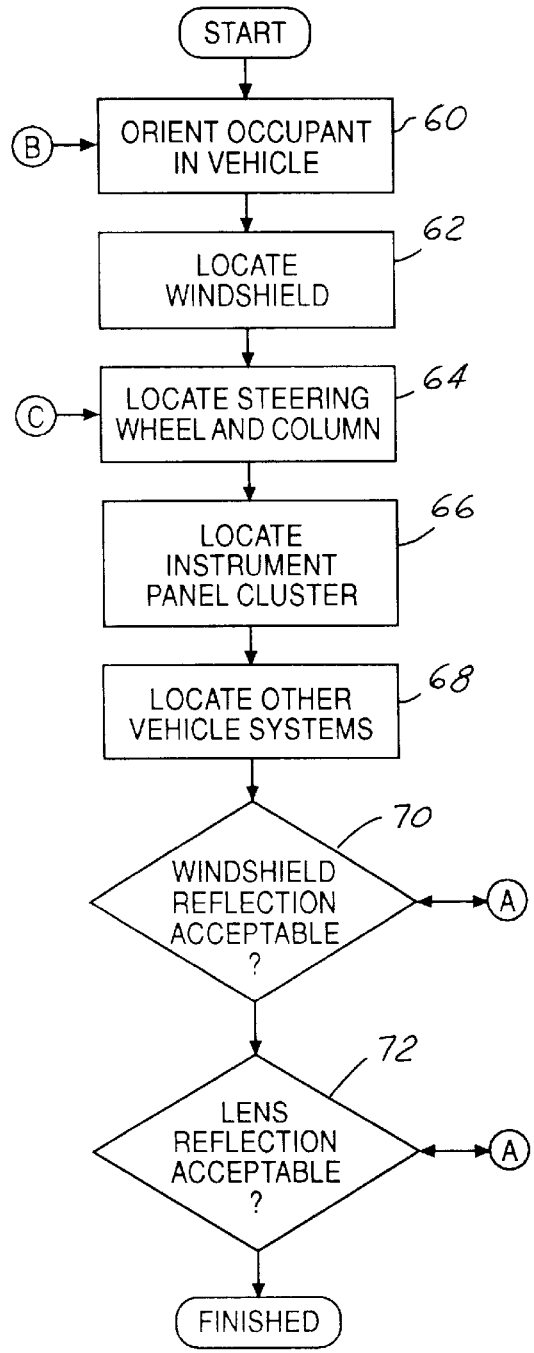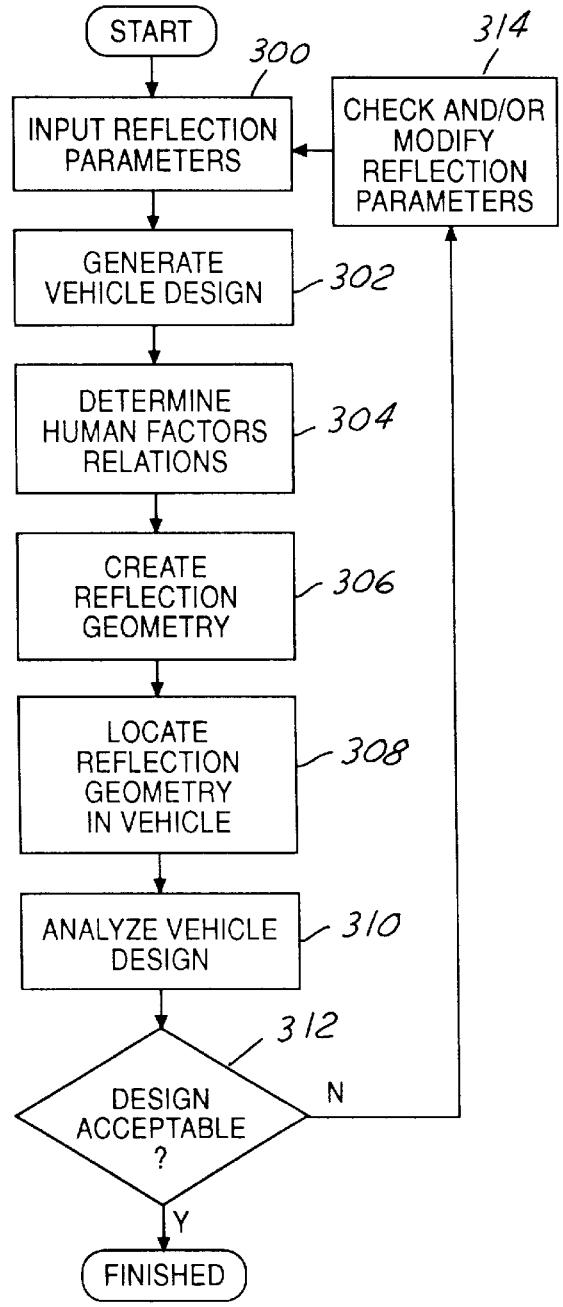
FIG. 5
FIG. 12

METHOD AND SYSTEM FOR VEHICLE DESIGN USING REFLECTION ZONES

FIELD OF THE INVENTION

The present invention relates to computer aided automotive vehicle design, in general, and more specifically to vehicle design based on reflection zones in a vehicle passenger compartment.

BACKGROUND OF THE INVENTION

Vehicle design has advanced to a state in which occupant comfort and convenience, sometimes called ergonomics or human factors, is on at least an even par with the transportive aspects of a vehicle. This evolution has been driven by the availability of new technologies, including instrument panel clusters, adjustable steering wheels and columns, vehicle electronics, and movable seats, to mention only a few. With the addition of each new technology to the automotive vehicle environment, however, has come additional complexity in packaging the various occupant appurtenances to best achieve both design and ergonomic functionality.

One aspect of this packaging task is to provide an occupant, particularly a vehicle driver, with a windshield view clear of reflection from internal sources. That is, a vehicle design goal is to locate vehicle systems and vehicle structure, such as a steering column shroud, so that an occupant's view will not have annoying reflections on the windshield. Current practice relies on various methods to determine whether a proposed design meets preferred occupant-to-vehicle reflection requirements. Typically, a proposed design is analyzed in two-dimensions which requires many "cuts" of a drawing. A three-dimensional "buck" is also used to give a better overall view of the design, but such physical representations are expensive, time consuming, and difficult to modify for a subsequent design. Since there may be many individual components which affect occupant reflection reception, the tasks associated with capturing all of the required human reflection factors packaging requirements are daunting. For example, a windshield reflection study, which determines whether internal vehicle objects will reflect onto a portion of the windshield in an occupant's view, can require several hours to complete. In total, performing human factors reflection studies typically requires many weeks under current practice, assuming the availability of experienced analysts to conduct all of the individual studies.

An additional problem with current design practice is that it leaves room for errors, due to the complex instructions required to perform the studies. Current design practice also is inflexible in that a change in one component, even a minor component, requires all human factors reflection studies to be redone, resulting in greater expense and delay of design completion.

SUMMARY OF THE INVENTION

The present invention overcomes the deficiencies of current vehicle design practice by providing a method and system which can quickly provide accurate human factors reflection studies for a vehicle design while allowing system packaging flexibility. The computer based system and method of the present invention orients an occupant representation, in electronic form, with respect to a three-dimensional electronic representation of a portion of the vehicle. At least one vehicle system is represented, also in electronic form, with respect to a common reference point. At least one human factors reflection study is performed to determine occupant reception of reflection from at least one vehicle system, and an outcome of that study is reported to a vehicle designer. The designer then has an option to vary, or alter, the occupant orientation, the location of the vehicle system, or both, so that the design meets the reflection criteria of the study. However, the designer may opt to retain the design despite non-compliance with the reflection criteria. In addition, a geometric representation of occupant reception of vehicle system reflection may be displayed to allow a designer to visually assess compliance with a particular reflection criteria. The occupant representation, vehicle, vehicle system, and geometric representation of the occupant reflection reception may be rendered and animated in three-dimensions permitting views from various perspectives.

An advantage of the present invention is a method and system for vehicle design which considerably reduces vehicle design time and expense.

Another advantage of the present invention is a vehicle design method and system which allows study of vehicle packaging feasibility early in the design process.

Still another advantage of the present invention is a vehicle method and system which supports computer aided engineering (CAE) analysis and rapid prototyping.

Another advantage is a method and system for vehicle design which provides informed design decision making which supports vehicle program timing, and which reduces late design changes.

Yet another advantage of the present invention is a vehicle design system and method which provides flexibility in vehicle design while not being constrained by timing requirements imposed in traditional prototype design development.

Still yet another advantage is a vehicle design system and method which provides generic, ergonomically sound parametric automated design of various portions of a vehicle.

A feature of the present invention is a vehicle design system and method which provides accelerated, three-dimensional solid modeling of automated reflection studies in packaging of vehicle systems.

Another feature of the present invention is the ability of a vehicle designer to easily alter any factor with the result that the system and method automatically rebuild every other effected dimension so that packaging alternatives can be quickly studied.

BRIEF DESCRIPTION OF THE DRAWINGS

The file of this patent contains at least one drawing executed in color. Copies of this patent with color drawings will be provided by the Patent and Trademark Office upon request and payment of the necessary fee.

The objects, advantages, and features of the present invention will be apparent to those skilled in the art upon reading the following description with reference to the accompanying drawings, in which:

FIG. 5 is a flow chart of an embodiment of a method for designing a vehicle according to the present invention;

FIG. 12 is a flowchart showing a method for vehicle design using occupant reflection reception surfaces according to the present invention;

DETAILED DESCRIPTION OF THE PREFERRED EMBODIMENT

Figure 1:
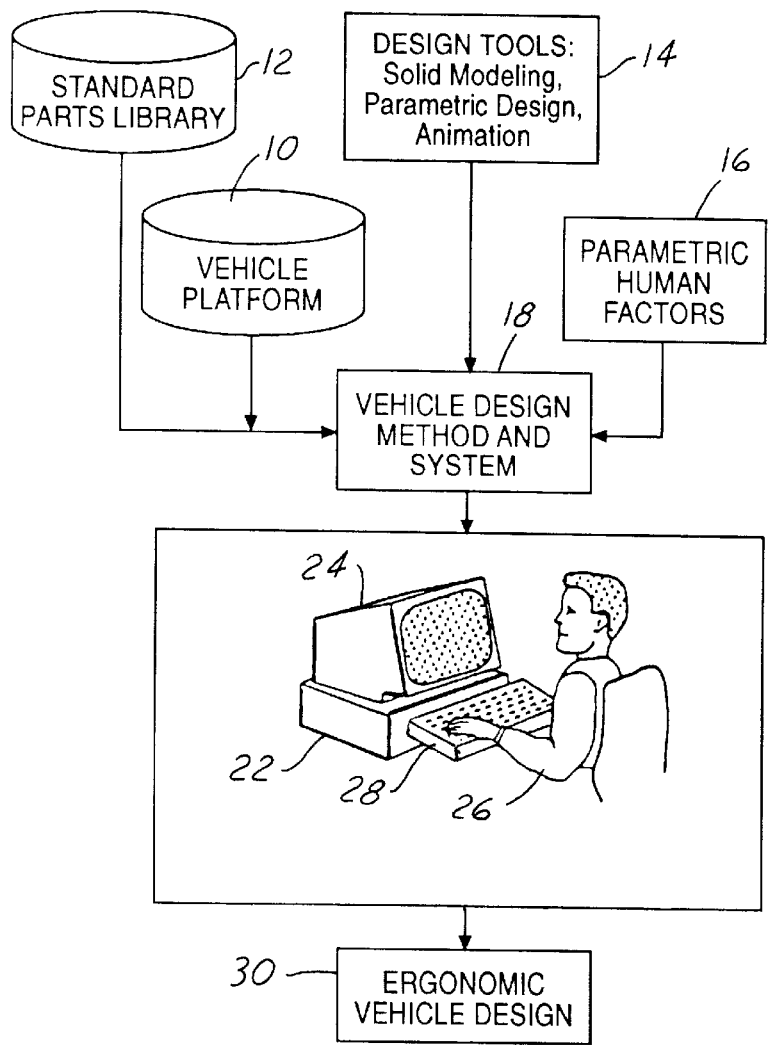
FIG. 1 is a flow chart illustrating various parts of a system for designing an automotive vehicle according to the present invention.

Automotive vehicle design, and in particular design with respect to occupant reflection reception of a portion of an automobile, is achieved according to the present invention with a generic, parametric driven design process. This process allows flexibility in vehicle design, including performance of numerous ergonomic occupant reflection reception studies in a small fraction of the time required with conventional vehicle design. The present invention enables an acceptable design to be achieved in minutes, as opposed to days and weeks previously required. Various computer based tools are integrated to achieve this enormous time and expense savings, including solid modeling, parametric design, automated studies, and a non-parametric component library, sometimes called a standard parts library. Referring to FIG. 1, the tools used by the method and system of the present invention are shown graphically. Vehicle platforms are electronically represented on an electronic storage device 10, which includes representation of vehicle sheet metal, for example. A standard parts library 12, also stored on an electronic medium, has electronic representations of production parts, generic parts, and others. Packaging studies with these parts can be done to assess many factors, including the potential for reuse and complexity reduction. Various design tools, shown generally at 14, can be used for this packaging task. Solid modeling takes electronically stored vehicle platform data and standard parts data and builds complex geometry providing part-to-part or full assembly interference checking. Several commercial solid modeling programs are available and generally known to those skilled in the art, such as Pro/Engineer® and IDEAS®. Solid modeling also allows three-dimensional visualization through use of rendering and animation systems, such as Vislab®, while being compatible with other computer aided engineering and rapid prototyping computer applications.

Parametric design is used in the electronic construction of vehicle geometry within a computer for ergonomic reflection studies of components and assemblies. As certain dimensions, or parameters, are modified, the computer is instructed to regenerate a new vehicle or part geometry. The parametric human factor reflection studies, generally shown at box 16, control and limit the design process in accordance with ergonomically desirable parameters, as is further discussed below.

Still referring to FIG. 1, the computer implemented method and system of the present invention, shown at box 18, advantageously combines all of the foregoing to provide an efficient, flexible, rapid design for a vehicle, or a portion of a vehicle, which meets predefined ergonomic reflection requirements. As seen in FIG. 1, the present invention is implemented on a computer system 22, including a processor and a memory, which can provide display and animation of vehicle, occupant, and vehicle part electronic representations on a display such as a video terminal 24. Parameter selection and control for the design method can be accomplished by a user 26 via a keyboard 28, or other user reflection device, such as a mouse. One input method could include a pop-up window with all current parameters, including an on-line description for the parameter and a current value therefor. Other input methods will occur to those skilled in the art. For example, parametric values may be picked from a table within a two-dimensional mode since some vehicle designers prefer to view an assembly in sections which can be laid out on a drawing.

Figure 2:
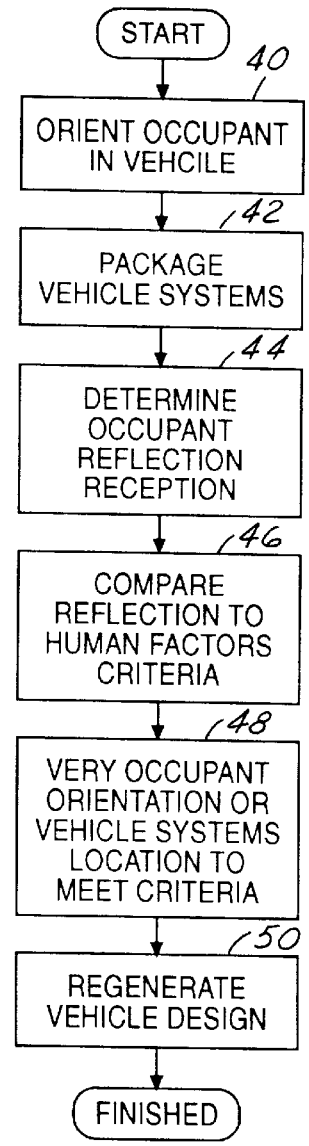
FIG. 2 is a flow chart of one embodiment of a method for designing a vehicle according to the present invention.
Figure 3:
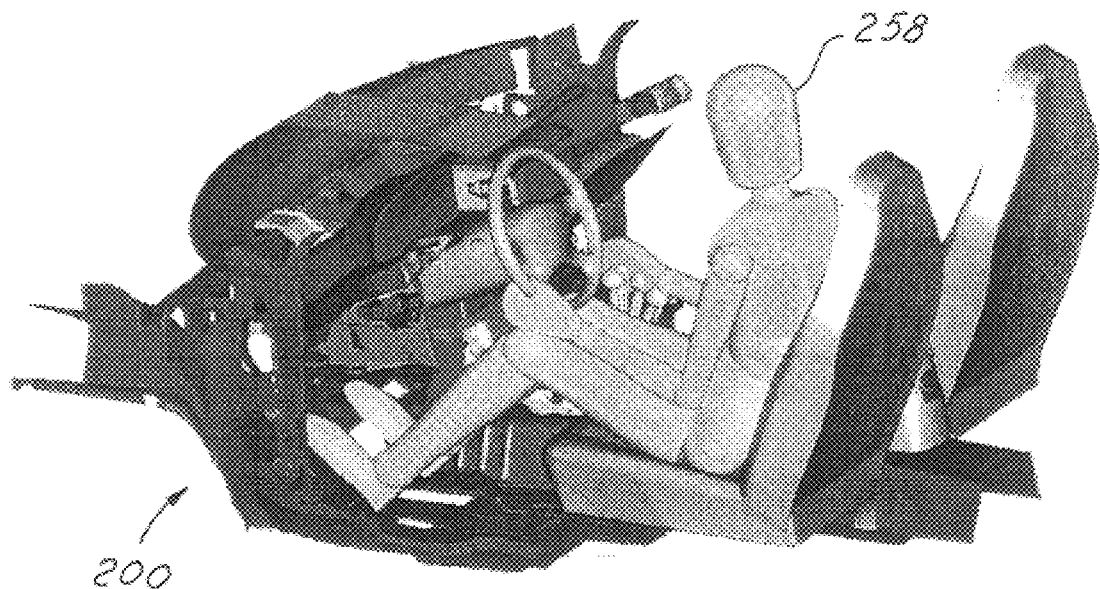
FIG. 3 is a color perspective view of a portion of an automotive vehicle having an occupant representation situated thereon representing a 95% male.
Figure 4:
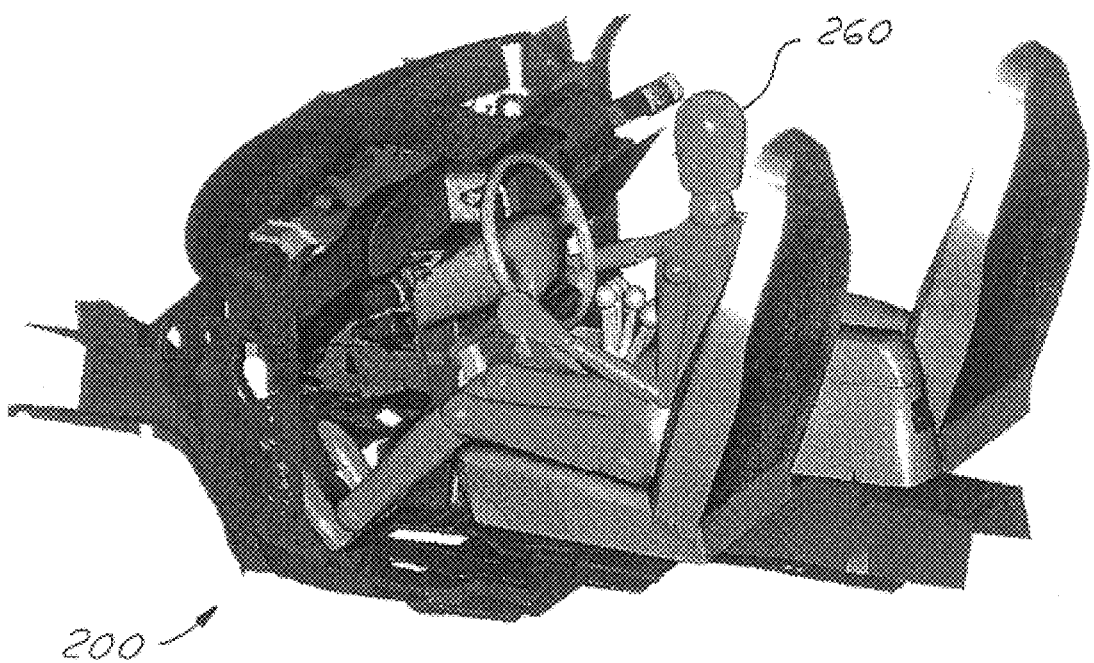
FIG. 4 is a color perspective view of a portion of an automotive vehicle having an occupant representation situated thereon representing a 5% female.

Turning to FIG. 2, a flowchart of a method according to the present invention is shown. A vehicle platform 207 is selected so that an electronic representation of vehicle sheet metal, including a floor plan, is available (FIGS. 3 and 4). It should be understood that use of the term vehicle in this disclosure implies an electronic representation of at least a portion of at least a portion of a vehicle, for example the floor pan sheet metal. Vehicle platform selection is optional, it being understood that occupant orientation and vehicle system packaging, as next described, need only be situated with respect to a common referenced point.

In box 40 of FIG. 2, an occupant representation is oriented in the vehicle. For purposes of this disclosure, orientation of an occupant means specifying or selecting values for a set of occupant position parameters which represent various occupant locations with respect to the vehicle. These occupant position parameters may include data for the three-dimensional location of an occupant hip point, a distance between an accelerator heel point and the occupant hip point, and occupant back angle. Selection of an occupant type, for example, may also be important so that occupant attributes, such as arm length and head height, are known. Various occupant types may be selected, including that for a 95% male 258 (FIG. 3) and the 5% female 260 (FIG. 4). Representation of an occupant in the form of a mannequin, as is done in many of the drawings herein disclosed, including FIGS. 3 and 4, is for user convenience only and is not necessary for operation of the method and system of the present invention. Rather, selection of certain occupant orientation parameters is all that is required. Those skilled in the art will recognize that other occupant position parameters may also be used, and that only one, or a combination of parameters, may be required to orient an occupant representation within the vehicle. Selection will depend on the particular human factors study to be performed.

After the occupant has been oriented as described above, various systems, devices, or components are then packaged on the vehicle (box 42, FIG. 2). For purposes of this disclosure, packaged means that an electronic representation of the dimensions of the system, device, or component are geometrically related to the vehicle three-dimensional electronic reference frame, coordinate system, or reference point. These systems may include, but are not limited to, instrument panel clusters, electronic clusters, including radios, tape players, and CD's, heating, ventilation, and air conditioning (HVAC) control panels and outlet ducts, door trim, glove box, air bags, knee bolsters, a steering wheel and column, a center console, a manual shift device, and seats. Vehicle systems is intended to include any part of the vehicle which will interact with an occupant, either directly or indirectly. Those skilled in the art will recognize that the foregoing list is intended to be illustrative only and not exhaustive. It should also be understood that occupant orientation (box 40) and packaging of vehicle systems (box 42) need not be accomplished in the order indicated in FIG. 2, but can be done in reverse order, or intermingled, that is, various systems may be packaged, the occupant oriented within the vehicle, and other systems subsequently packaged.

After the occupant is oriented and the vehicle systems are initially packaged as described above, occupant reflection reception with respect to various vehicle systems is then determined (box 44, FIG. 2). Occupant reflection reception, which for purposes of this disclosure means perception of reflected light by a vehicle occupant, may be determined in many ways, for example generating reflection geometries, including distances, surfaces, and zones. The reflection geometries may represent, but are not limited to, a windshield reflection zone and surface, and an instrument panel cluster lens reflection zone and surface. Other reflection geometries may also be generated. The aforementioned occupant reflection reception geometries are determined with the design tools described above, including solid modeling, parametric design and animation. Those skilled in the art will understand that other design tools may also be used to determine various occupant reflection receptions with the vehicle systems.

Three dimensional geometric representations of reflection from a vehicle system to an occupant may be generated. These reflection geometries may then be communicated to the user, such as by reporting or displaying. Animation on a video screen in three-dimensions with different colors representing various vehicle systems, occupant representations, and reflection zones can be used to effectively communicate study results. However, a printed report of whether any vehicle systems will reflect onto an occupant, may be sufficient.

Still referring to FIG. 2, when occupant reflection reception has been determined, it may be compared to a set of human factors reflection criteria, as shown in box 46. The human factors criteria comprise a set of data or information which specifies a preferred occupant reflection reception. Such reflection criteria may include, for example, the requirement that there be no reflection from vehicle systems into the occupant C zone, which is a specified portion of the windshield. Numerous other human factors reflection criteria can be used in the comparison of box 48. The comparison may be done visually, such as viewing a reflection zone from various perspectives of the vehicle to determine if any vehicle systems fall within the zone.

If vehicle system reflection does not meet a corresponding human factors reflection criteria, adjustment to the vehicle design can be made by varying the occupant orientation, the vehicle systems locations, or both, or any generic parameter, as shown in box 48 (FIG. 2). Adjustment of the various parameters may be non-iteratively performed, that is, a vehicle designer may change one or more of the parameters based on past design experience in a single step, or steps. Alternatively, the steps of FIG. 2 may be iteratively performed until an acceptable design is achieved or a conclusion is made that such a design is not possible. Variation of the parameters may be conducted interactively through user 26 input (FIG. 1). It should be understood that variation of the occupant orientation or the vehicle systems is optional and that the human factors reflection criteria may or may not be required to be met.

When a change is made to the occupant orientation, a vehicle system, or any design parameter, for example a locational change with respect to the chosen coordinate system, regeneration of the entire vehicle design is electronically performed (box 50 of FIG. 2). During this regeneration step, appropriate relationships between the occupant representation, the vehicle systems, and the vehicle are automatically determined, and vehicle systems are automatically changed according to the revised parameters. That is, the method and system of the present invention will automatically rebuild every other affected dimension so that packaging alternatives can be quickly studied. In the regeneration step, originally selected vehicle systems or devices may need replacement to fit with the new design. This replacement is automatically done by selection of vehicle systems or devices from the electronic parts library 12 (FIG. 1) to meet the vehicle system change, for example a locational change. It should therefore be understood that some changes to a vehicle design are selected by a vehicle designer, as discussed above and further discussed below with respect to FIG. 10, while other changes are accomplished automatically by the system and method of the present invention to accommodate designer specified changes. This feature allows packaging alternatives to be quickly studied.

Figure 6:
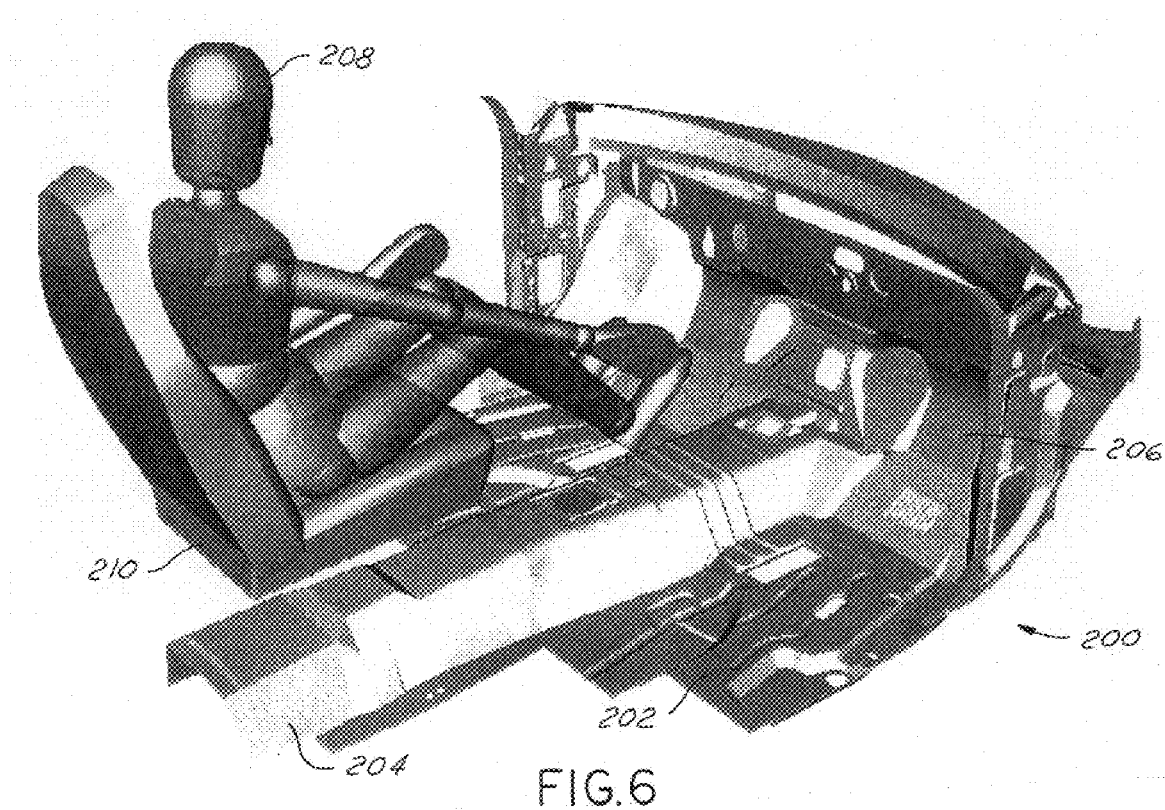
FIG. 6 is a color perspective view of a portion of an automotive vehicle showing an occupant representation oriented on a seat therein.

Turning now to FIG. 5, a detailed example of vehicle design according to one embodiment of the method of the present invention is shown. As seen in FIG. 6, a vehicle platform 200, shown in light gray, is selected to generate a three-dimensional, electronic representation of a floor pan 202, a transmission tunnel 204, and a front wall 206 (all shown in light gray). It should be understood that selection and display of the vehicle platform 200 shown in FIG. 6 is optional and not required for the method of the present invention. Selection of a vehicle platform may be from a list of vehicle platforms and will determine the three-dimensional coordinates of the platform in an electronic form as represented in the memory of the computer 22.

After selection of the vehicle platform, an occupant representation 208, shown in yellow in FIG. 6, is orientated in the vehicle as depicted in box 60 of FIG. 5. Orientation of the occupant representation 208 is accomplished as described above. This orientation includes selection of an occupant type which determines an occupant eye location, and thus an occupant eyellipse size, as further discussed below. For example, selection of a 5% female occupant type determines a vertical distance between a hip point and an eyellipse centroid for a female representing the smallest 5% of the female population. This distance, as well as others, for example distances in the longitudinal (x-axis) and lateral (y-axis) directions, are related to the vehicle reference frame, or to a common reference point, through the various occupant orientation parameters, for example, the occupant hip point.

Still referring to box 60 (FIG. 5), a seat 210 (orange, FIG. 6) is next located with respect to the vehicle platform 200 and the occupant representation 208, and the location of the seat 210 with respect to the occupant 208 will in part determine the type of seat which may be used in construction of the vehicle. Location of the seat is optional and not required for the reflection studies of the present invention.

Figure 7:
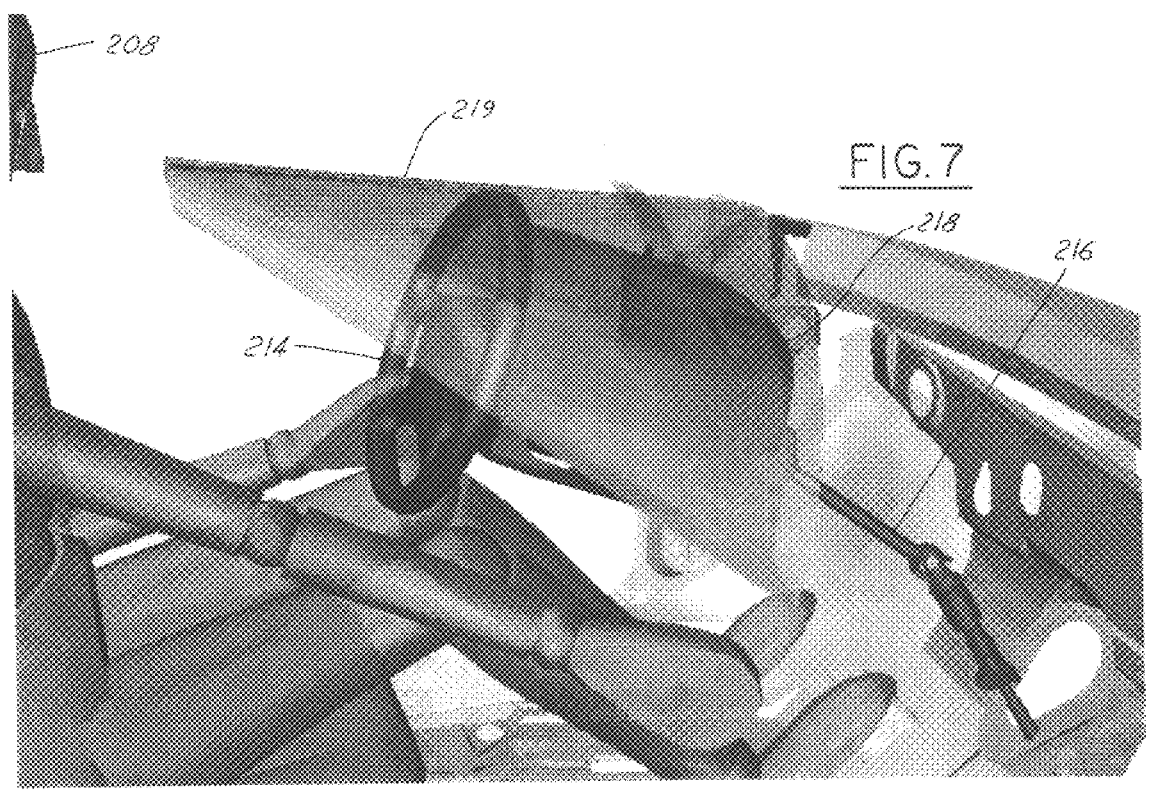
FIG. 7 is a color perspective view showing packaging of a steering column and steering wheel according to the present invention.

Next, in box 62, a windshield 212 (?????, FIG. 7) is located (box 62, FIG. 5). A steering wheel 214 and steering column 216 (shown in blue, FIG. 7) can then located (box 64, FIG. 5), but such may or may not be necessary for performing the reflection studies of the present invention. As with all of the systems packaged by the method of the present invention, the steering wheel and column may be selected from a list of electronic representations of those parts. The steering wheel and column are located such that the occupant in the driver's seat is able to access and easily use the steering wheel 214.

An instrument panel cluster 218 (purple, FIG. 7) is next packaged (box 66, FIG. 5), preferably by performing a rimblock study which determines, electronically, a zone which is obstructed from the driver's view in the forward direction by the steering wheel and steering wheel hub. This zone is referred to as a rimblock zone 219 (shown as yellow and green in FIG. 7) and is used for proper placement of an instrument panel cluster containing gauges and other vehicle performance indicating devices. The IP cluster 218 is preferably placed out of the rimblock zone 219 and is positioned so that important portions of the gages and indicating devices do not fall into the rimblock area. The IP cluster 218 includes a lens (not shown), which, as further described below, is used in a lens reflection study.

Other vehicle components, including center stack components, can next be packaged (box 68 of FIG. 5). The center stack is that portion of the instrument panel in the center of the vehicle typically containing a panel, or panels, having instrument controls for vehicle audio electronics, HVAC controls, and the like. The center stack may also contain HVAC outlets. It should also be understood that other HVAC outlets and instrument panel controls may also be packaged during this step of the method of the present invention, for example, lighting controls for both the exterior and interior may be located outboard of the steering column on the instrument panel. Packaging of these components for purposes of this disclosure means selecting a device, component, or system and electronically representing such in a location proximate other vehicle structure so as not to interfere with adjacent components or structure.

Figure 8:
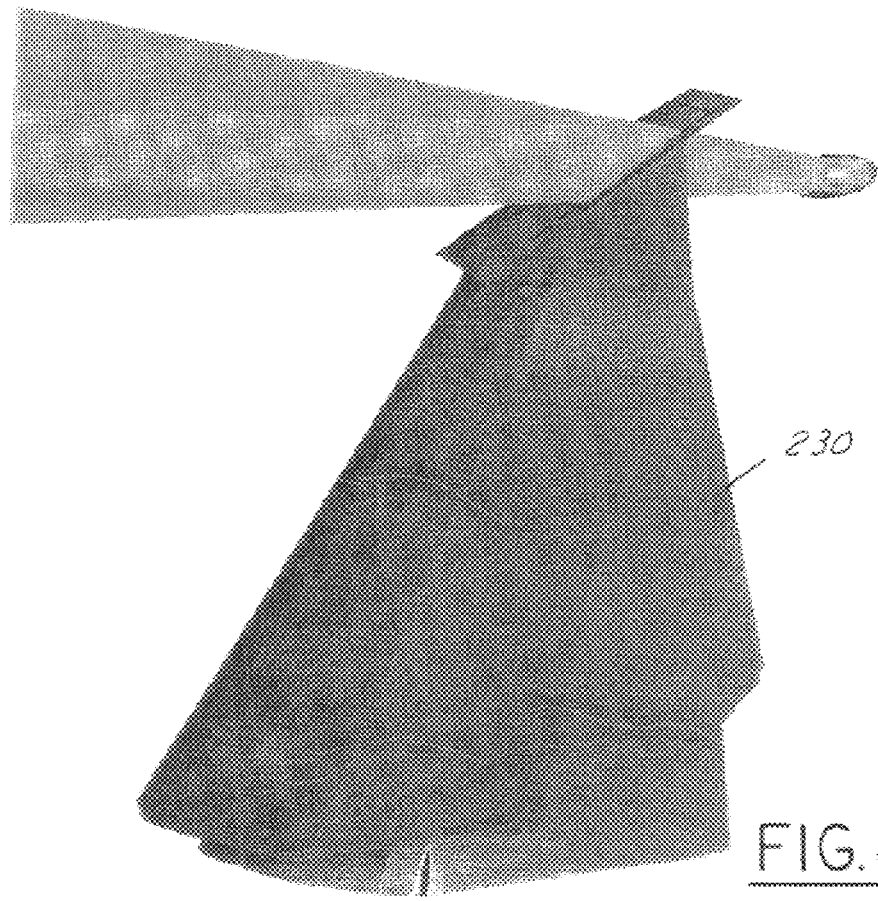
FIG. 8 is a color perspective view of a windshield reflection zone for determining occupant reflection reception with respect to a windshield.
Figure 9:
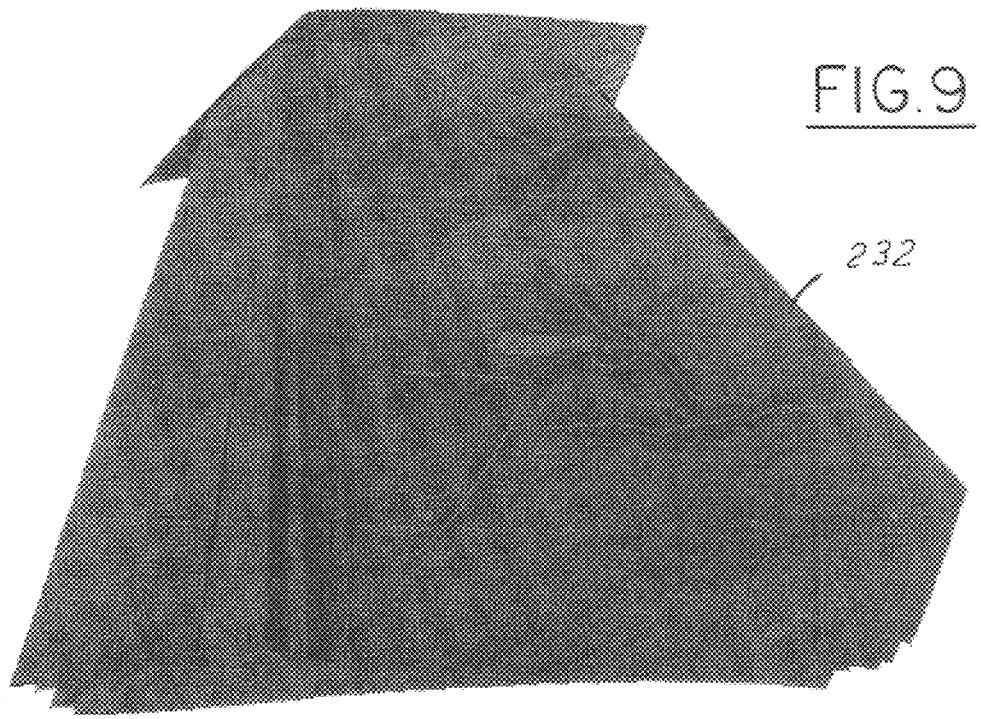
FIG. 9 is a color perspective view of an instrument panel cluster reflection zone for determining occupant reflection reception with respect to an instrument panel.

After the instrument panel components, devices, and systems have been packaged, various studies may be electronically performed to determine whether the package is satisfactory from a human factors criteria standpoint. Such studies may include, for example, a windshield reflection study using a windshield reflection zone 230 (FIG. 8) and an instrument panel cluster lens reflection study using a lens reflection zone 232 (FIG. 9). Other zones may also be made. At box 70 in FIG. 5, a windshield reflection study is performed to determine if windshield reflection is satisfactory from a human factors standpoint, and at box 72 an instrument panel cluster lens reflection study is performed.

Figure 10:
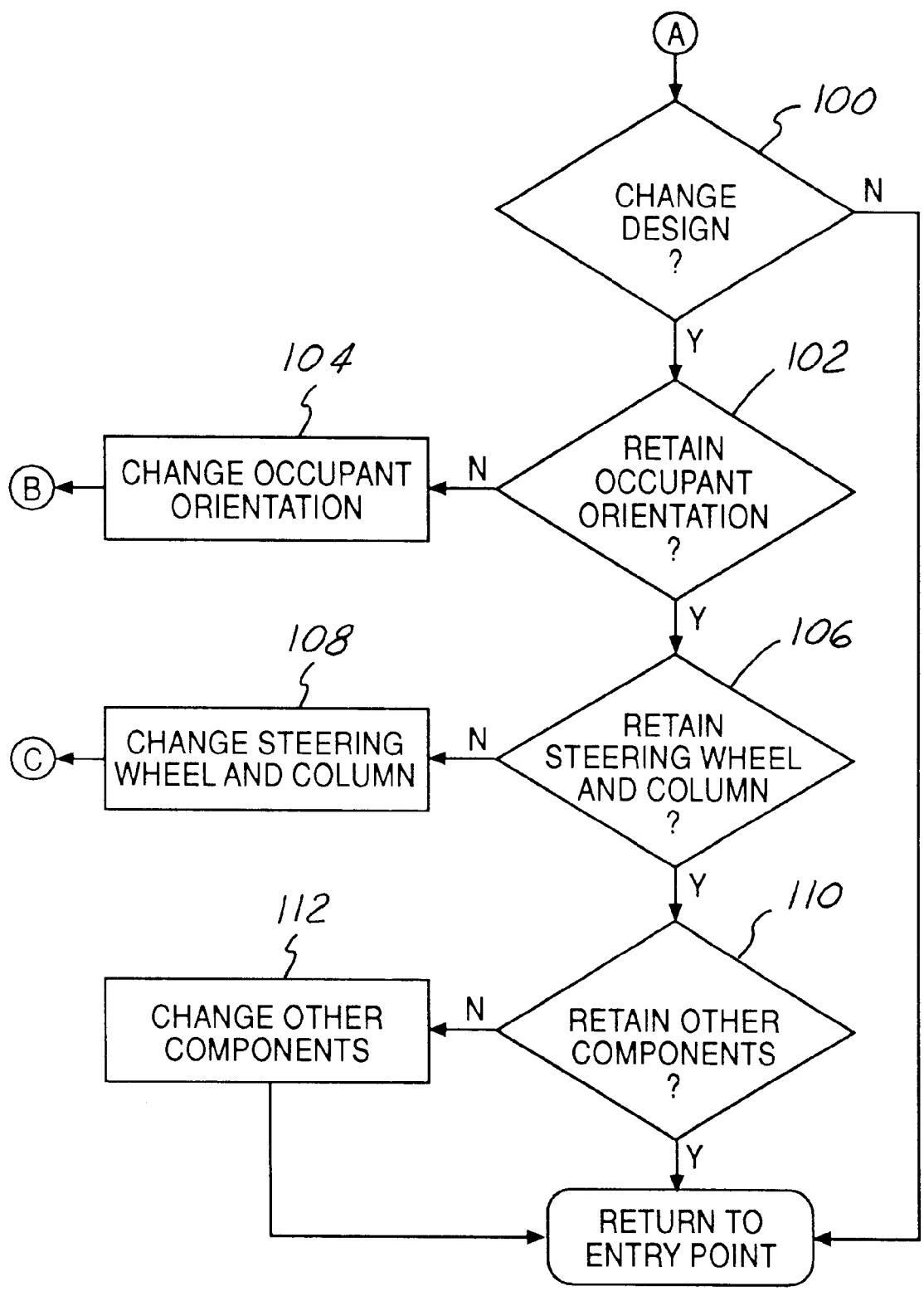
FIG. 10 is a flow chart showing a design change process optionally used with the vehicle design method according to the present invention.

Should the packaging be unacceptable from a human factor perspective, vehicle design alteration may be made. A design alteration determination flow chart, as shown in FIG. 10, can be used to perform changes to vehicle design, if any. In the first decisional diamond 100 of FIG. 10, the desire for design change is questioned. If the decision is made not to change vehicle design despite it not meeting designated human factor criteria, the flow is returned to the entry point from the flow chart in FIG. 5. Such a decision may be made, for example, when non-ergonomic considerations outweigh the desirability of design change for ergonomic reasons.

Continuing with FIG. 10, should there be a desire to investigate changing the vehicle design, retention of the current occupant orientation is made in the second decisional diamond 102. If it is determined not to retain the current occupant orientation, then a change is made thereto in box 104, and the flow is returned to entry point B in the flow chart of FIG. 5. If it is determined to retain the current occupant orientation, the flow in FIG. 10 moves to the third decisional diamond 106 where it is determined whether to retain the current packaging configuration of the center stack components. If it is determined not to retain these current center stack components, the change is made in box 108 and the flow is returned to entry point C in the flow chart of FIG. 5. It should be noted that a change to the packaging arrangement of the center stack components, alone or in conjunction with a change to the occupant orientation, may be made meet a given reflection criteria. However, if it is determined to retain the current packaging of the center stack components, the flow in FIG. 10 goes to the fourth decisional diamond 110 wherein it is determined to retain other vehicles components. If it is determined not to retain other vehicle components, then those components, or a subset thereof, are changed in box 112 and the flow returns to the entry point in the flow chart of FIG. 5, that is, the point in FIG. 5 which routed decisional flow to FIG. 10. However, if it is determined to retain the other vehicle components, then flow is returned to entry point A in the flow chart of FIG. 5 without any changes having been made to the vehicle design. It should be understood that the just described vehicle design change flow chart of FIG. 10 is optional and that the method and system of the current invention need not employ such a design change method or means for accomplishing such. It should further be noted that there are numerous possibilities for design change flow chart logic, and that FIG. 10 is meant to be illustrative and not limiting.

Figure 11:
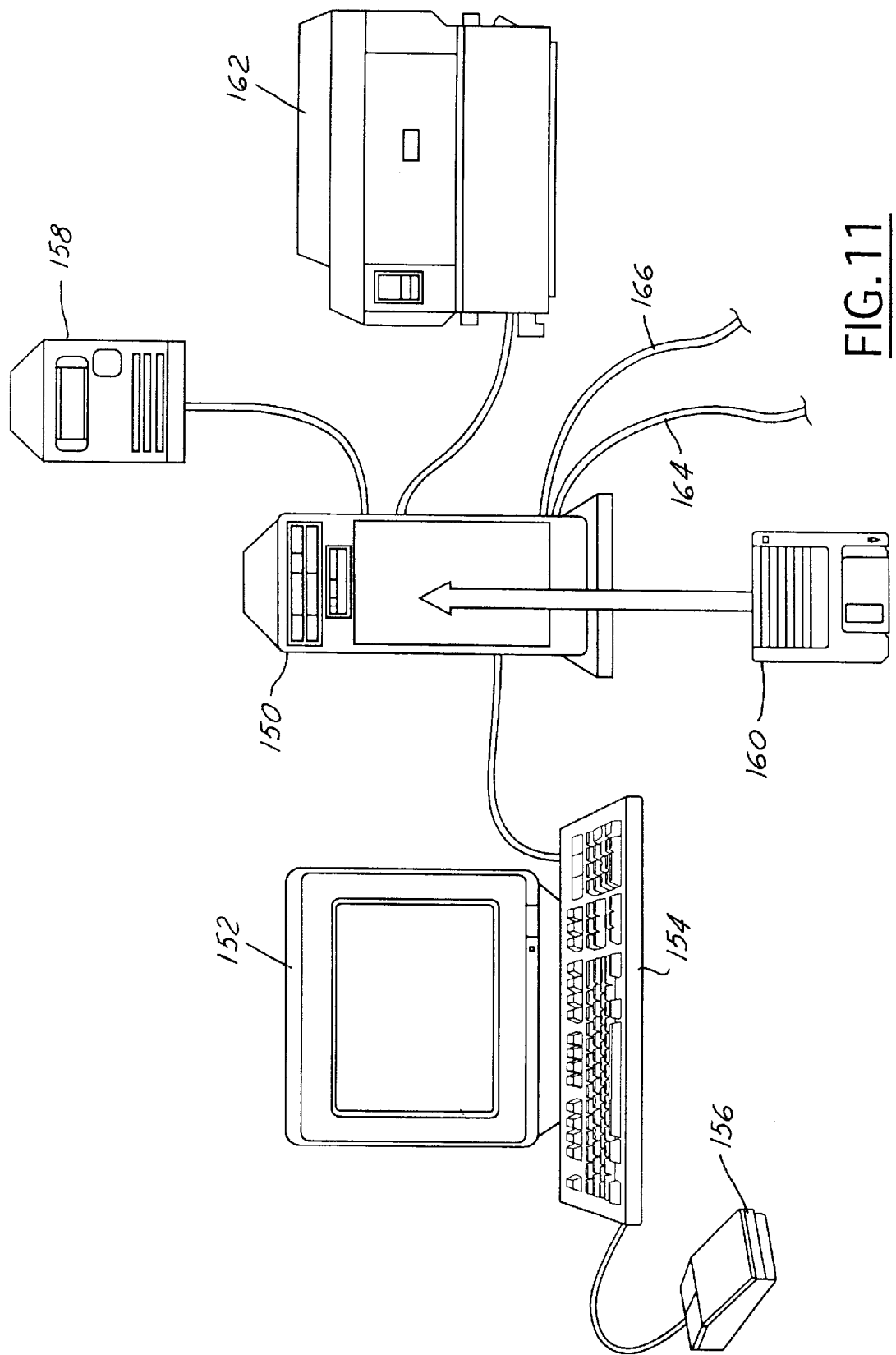
FIG. 11 is a view of a system for designing a portion of an automotive vehicle according to the present invention.

A representative system for occupant based vehicle design according to the present invention is depicted in FIG. 11. The system includes a processing unit 150 connected to a user interface which may include a display terminal 152, a keyboard 154, a pointing device, such as a mouse, 156, and the like. The processing unit 150 preferably includes a central processing unit, a memory, and stored instructions which implement a method for vehicle design according to the present invention. The stored instructions may be stored within the processing unit 150 in the memory, or in any non-volatile storage such as magnetic or optical media, EPROM, EEPROM, or the like. Alternatively, instructions may be loaded from removal magnetic media 160, such as a removal disk, sometimes called a floppy disk, optical media 158, or the like. In a preferred embodiment, the system includes a general purpose computer program to implement the functions illustrated and described with reference to FIGS. 1–10. Of course, a system according to the present invention could also be embodied with a dedicated device which includes various combinations of hardware and software. The preferred embodiment may also include a printer 162 connected to the processing unit 150, as well as a server and a connection to an intranet 164 or the Internet 166. Preferably, solid modeling software, parametric design software, surface rendering software, animation software, and the like are used for developing a system according to the present invention.

A method for vehicle design using occupant reflection reception surfaces according to the present invention is shown in FIG. 12. Beginning in box 300, various reflection parameters are input into the system. Preferably, a set of default input reflection parameters are available which can be modified by a vehicle designer to meet design specifications. These input reflection parameters may include, for example, an eyellipse location, preferred vision zone, vehicle width, the steering wheel outer diameter (W9), the steering wheel sideview angle, a back angle (L40), steering wheel geometry, a center location for the steering wheel, a planview rotation angle for the steering wheel, a location for the cluster graphics plane, a graphics plane rotation angle, a mask draft and offset, a maximum trim cover blockage offset, a trim cover opening width, and a trim cover planview radius. Those skilled in the art will recognize that some of the input reflection parameters may be SAE parameters. Other input parameters may also be defined to further refine the occupant reflection reception studies of the present invention.

In box 302 of FIG. 12, a vehicle design is generated, and in box 304 various human factors relations are determined after the input reflection parameters have been identified. A reflection geometric representation is created in box 306 and is located in box 308. That is, the reflection surface geometry is electronically oriented within the vehicle. In box 310, the vehicle design is analyzed with respect to the reflection surface. In the decision diamond 312, if the design is acceptable, then the process for the particular reflection study is finished. However, if the design is not acceptable, then the flow branches from the decision diamond 312 to the box 314 in which the input reflection parameters are checked to determine if they are satisfactory, and/or the input parameters are modified. The flow then returns to box 300 in which the modified parameters are input to the method and system of the present invention, and the process flow continues as just described.

Figure 13:
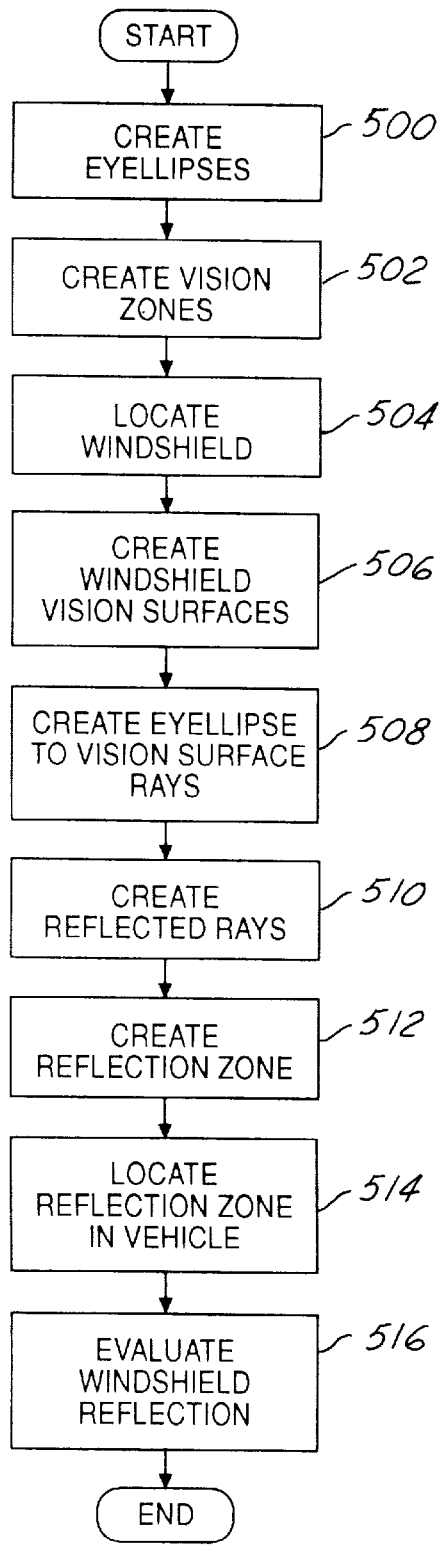
FIG. 13 is a flowchart showing creation of a windshield reflection zone for use in a human factors reflection study according to an embodiment of the present invention.

An example of an occupant reflection reception study of the present invention is shown in FIG. 13, in particular, a windshield reflection study. Beginning in box 500, eyellipses are created to represent occupant eye location. Eyellipse creations is best understood with reference to FIGS. 14A, 14B, 15A, 15B, 16A, and 16B. An eyellipse, for purposes of this disclosure, means a geometrical representation of the location of most driver's eyes. The geometry takes the form of an ellipse and is further described in SAE J491. As with other geometry created by the method and system of the present invention, logic is employed for such creation and may be expressed as equations of numbers and variables, geometric relationships, if-then loops, and other methods. In general, the logic is used to apply engineering and ergonomic knowledge, to reduce work required to perform similar operations, and to allow the geometry to change based on a designer's inputs.

Figure 14A:
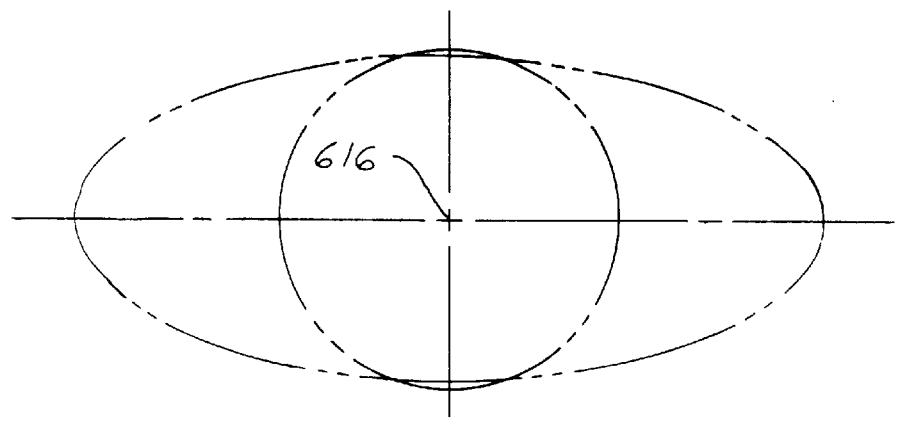
FIG. 14A shows orientation of an ellipse for use in creation of an eyellipse.
Figure 14B:
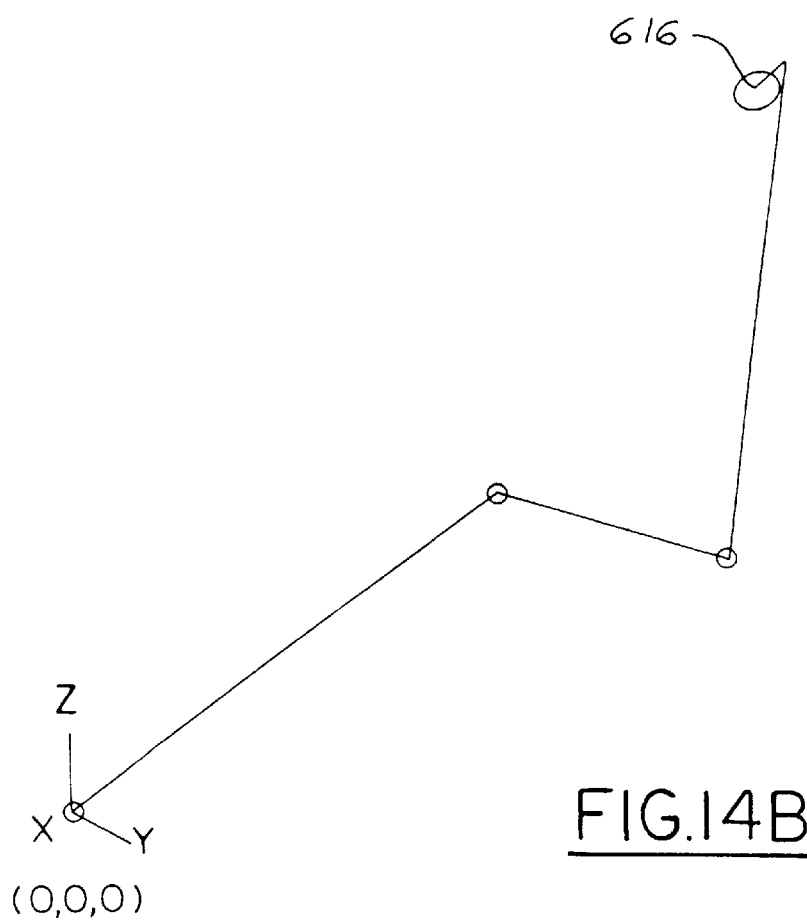
FIG. 14B is a perspective view showing orientation of an eyellipse with respect to a vehicle coordinate system.
Figure 15A:
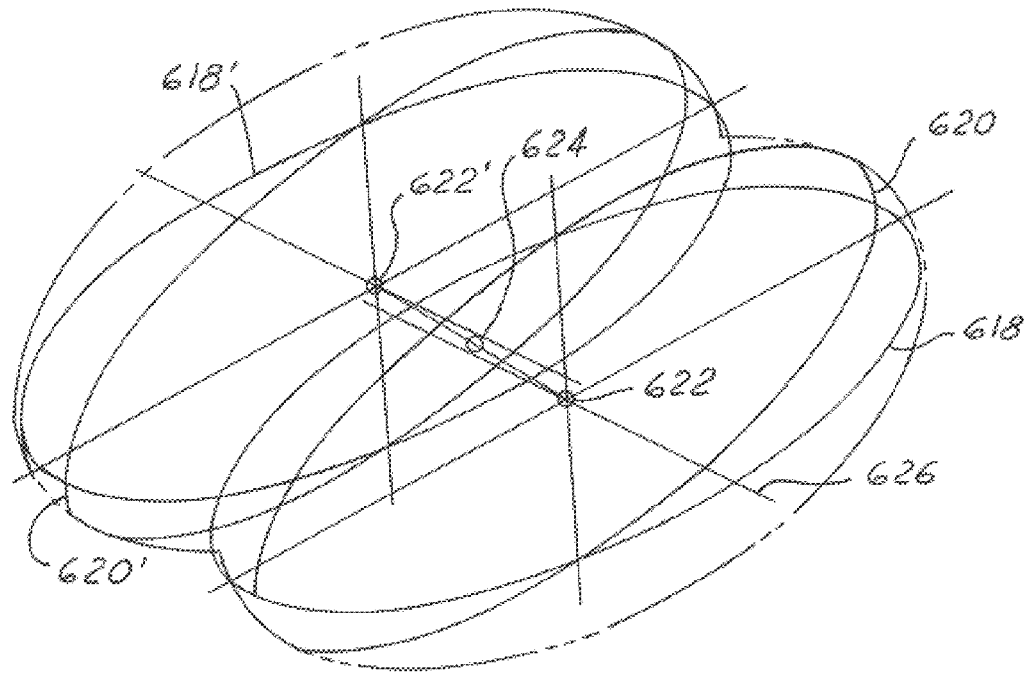
FIG. 15A is a perspective view of a pair of eyellipses representing probable eye locations of a given occupant population.
Figure 15B:
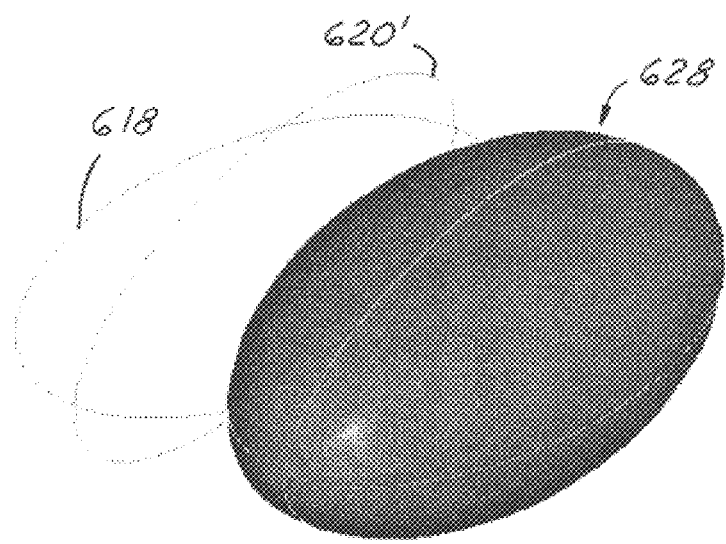
FIG. 15B is a perspective view of an eyellipse and a pair of orthogonal ellipses.
Figure 16A:
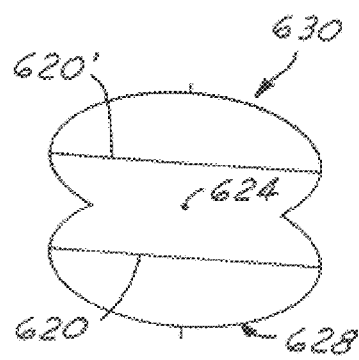
FIGS. 16A and 16B show plan and side perspective views, respectively, of the pair of eyellipses of FIG. 15A.
Figure 16B:
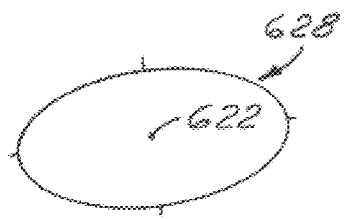

Returning to the eyellipse creation of box 500, which is performed once for each eye of a vehicle driver, an eyellipse center 616 (FIG. 14A) is located three-dimensionally with respect to a vehicle coordinate system, for example, in the X, Y, and Z directions (FIG. 14B). After the center has been located, an ellipse shape is created, preferably based on SAE guidelines (Motor Vehicle Drivers' Eye Locations-SAE J941), for both a planview ellipse 618 and a side view ellipse 620 (FIG. 15A). It should be understood that a planview ellipse 618' and a side view ellipse 620' are created for the other eye as well (FIG. 15A). Each eyellipse has a centroid 622, 622', respectively, and an eyellipse pair centroid 624 (FIG. 15A) is defined a the midpoint between a line 626 connecting the eyellipse centroids 622, 622'. The ellipses 618, 620 and 618', 620' create frames (FIGS. 15A–16B) about which a surface is rendered to provide a three-dimensional representation of eyellipses 628, 630 for a left and right eye, respectively. It should be understood that the eyellipses 628, 630 intersect, as best seen in FIG. 15A and 16A.

Figure 18A:
FIGS. 18A, 18B, and 18C are perspective views corresponding to three occupant vision zones of varying scope intersecting a windshield.
Figure 18B:
Figure 18C:
Figure 17A:
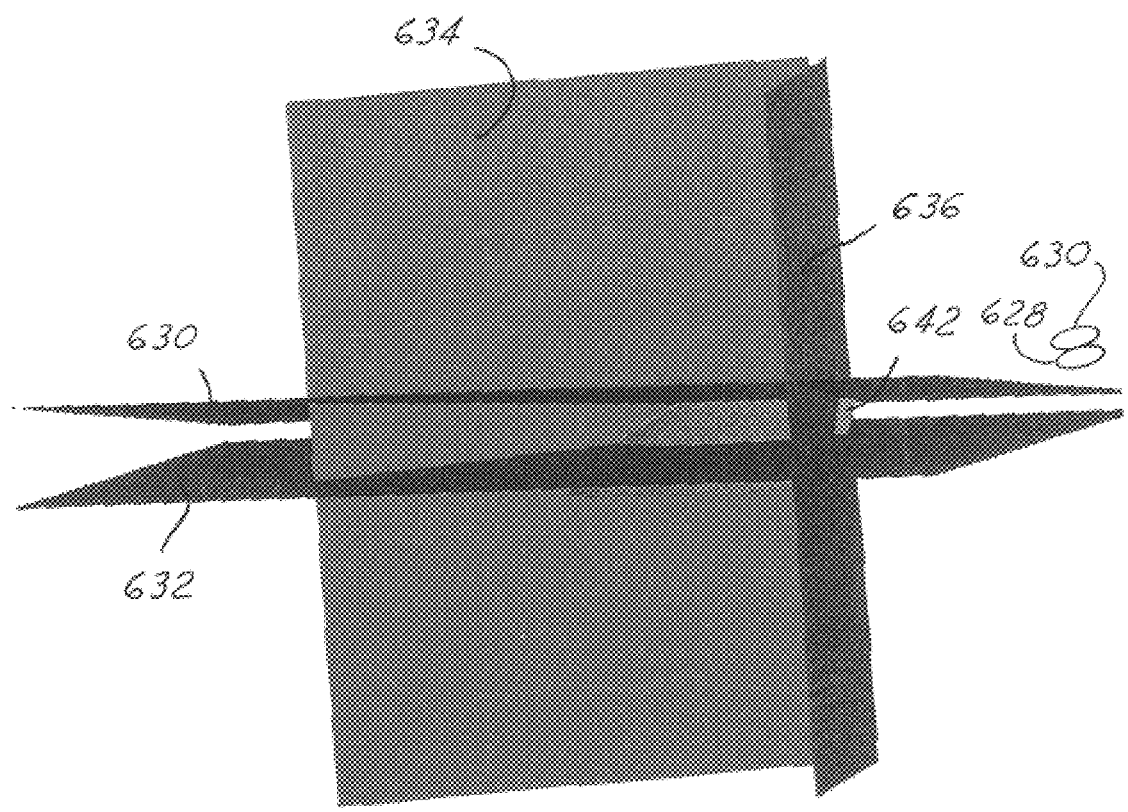
FIG. 17A is a perspective view of four planes oriented at predetermined angles to the pair of eyellipses for determining an occupant vision zone.
Figure 17B:
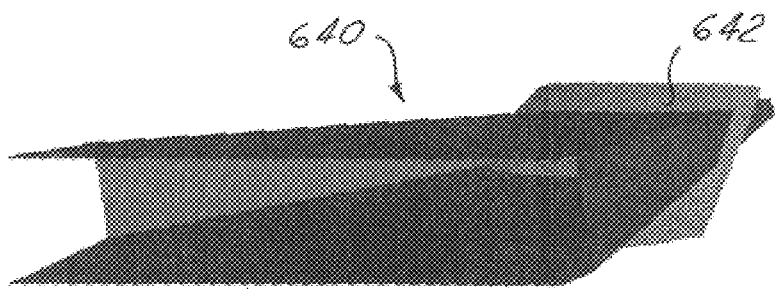
FIG. 17B is a perspective view showing the planes of FIG. 17A trimmed to provide an occupant vision zone relative to a windshield.
Figure 19A:
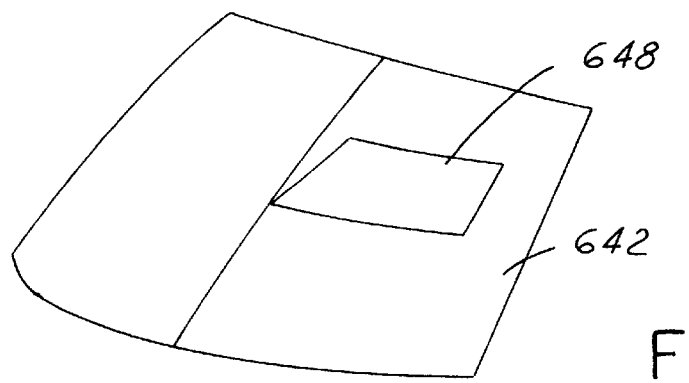
FIGS. 19A, 19B, and 19C are perspective views of three occupant vision surfaces on a windshield corresponding to the intersection of the vision zones in FIGS. 18A, 18B, and 18C, respectively.
Figure 19B:
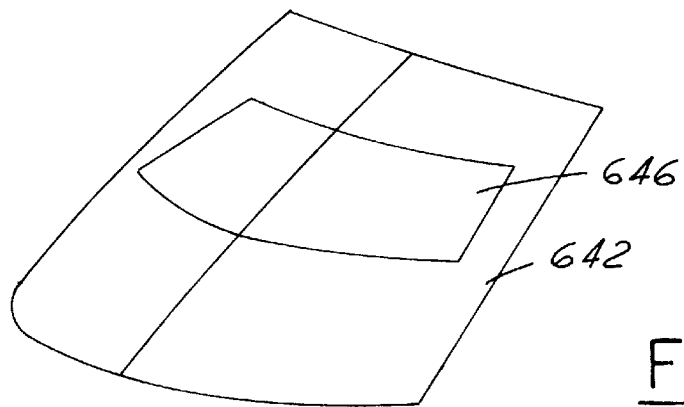
Figure 19C:
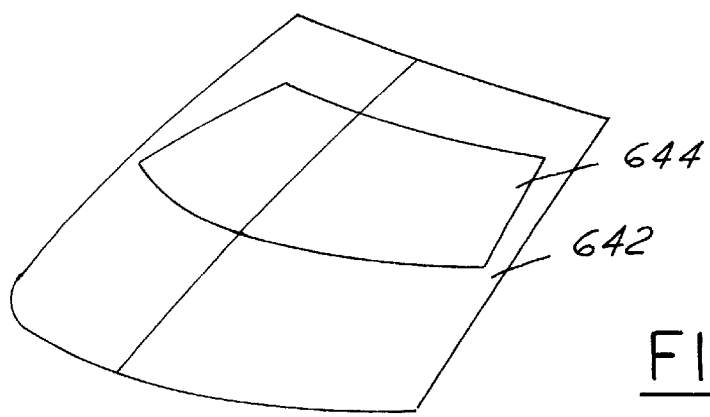
Figure 20A:
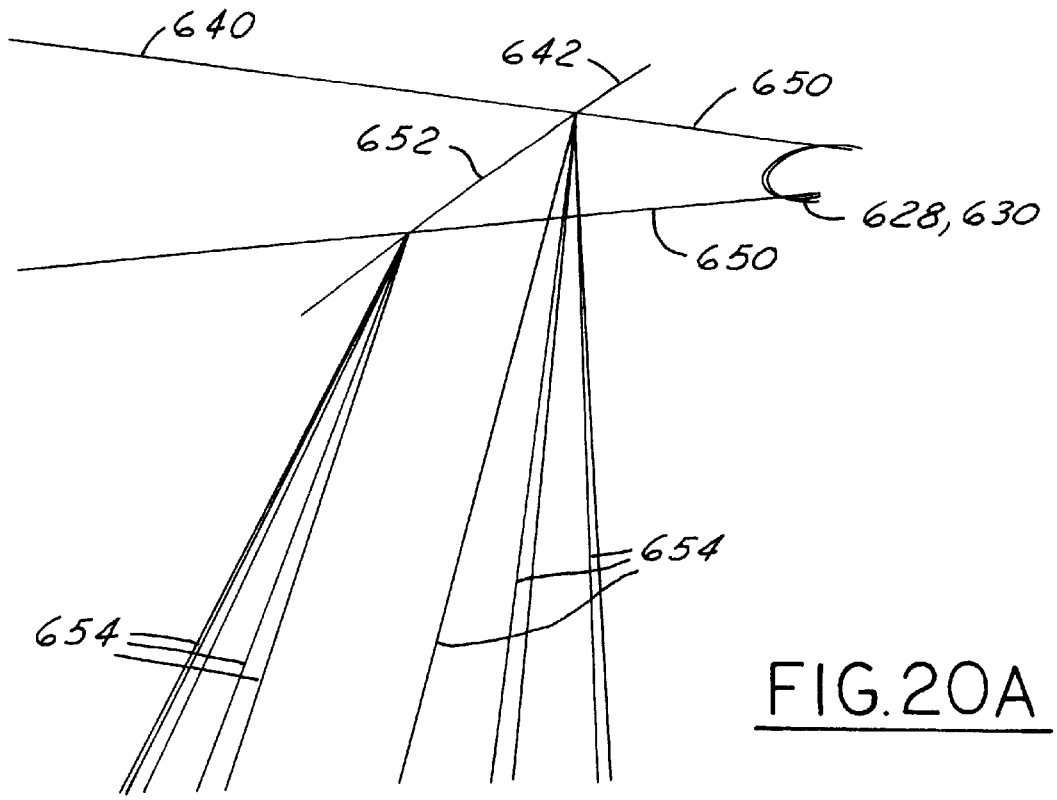
FIG. 20A is a side view showing rays emanating from the eyellipses and reflecting from an occupant vision surface on the windshield to create a reflection zone.
Figure 20B:
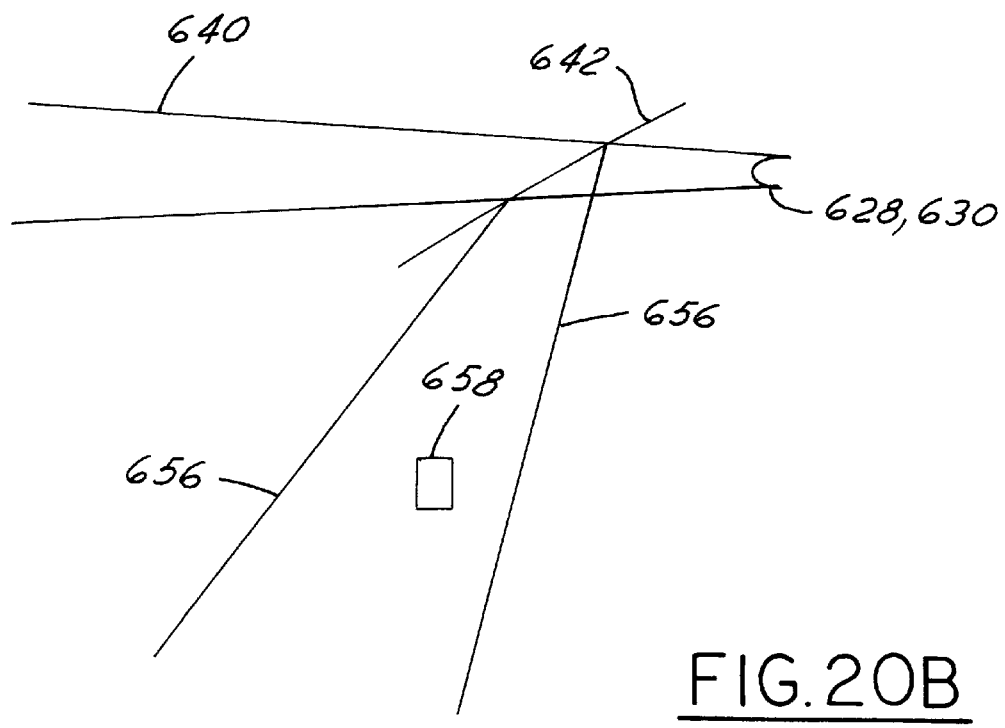
FIG. 20B shows location of a reflection in a vehicle for evaluation of occupant reflection reception.

After the eyellipses have been created, an occupant vision zone is created (box 502, FIG. 13). As seen in FIG. 17A, a pair of planes 632, 634 are located above and below, respectively, the eyellipses. The planes 632, 634 are oriented at predetermined angles with respect to a horizontal plane, with the upper plane 632 angled generally upward in a direction away from the eyellipses, and the lower plane 634 angled generally downward in a direction away from the eyellipses. Likewise, a pair of generally vertical planes 636, 638 are located at predetermined angles with respect to a longitudinally running plane, with one of the planes 636 angled generally toward a first side of the windshield in a direction away from the eyellipses, and the other plane 638 angled generally toward a second side of the vehicle away from the eyellipses in a direction opposite the plane 636. The planes 632, 634, 636, 638 are then trimmed (FIG. 17B) to provide an occupant vision zone 640 with respect to a windshield 642, which is located in box 504 (FIG. 13). Various sized occupant vision zones may be created, for example, corresponding to A, B, and C vision zones, as seen respectively in FIGS. 18A, 18B, and 18C. As those skilled in the art will understand, such zones represent recognized occupant vision zones for vehicle design. Each vision zone is then intersected with the windshield 642 to create a windshield vision surface (box 506, FIG. 13). Vision surfaces 644 (FIG. 19A), 646 (FIG. 19B), and 648 (FIG. 19C) represent windshield intersection of the A, B, and C vision zones of FIGS. 18A, 18B, and 18C, respectively. Next, in box 508 (FIG. 13), rays 650 from the eyellipses 628, 630 to the windshield 642 in the selected vision surface 652 are created (FIG. 20A). Reflected rays 654 (FIG. 20A) are then created (box 510, FIG. 13), by using, for example, an angle of reflection from the windshield equal to the angle of incidence on the windshield. Rays 650 are interspersed over the entire area of the vision surface 652 and the reflected rays 654 are then used (box 512, FIG. 13) to create a three-dimensional reflection zone 230 (FIG. 8). The reflection zone 656 is located in a vehicle design (box 514, FIG. 13) and windshield reflection analysis is performed (box 516, FIG. 13). If a vehicle component 658 is in the reflection zone 656 (FIG. 20C), there will likely be a reflection of that component from the windshield into the occupant's eyes. A vehicle designer may desire to remedy the situation using the design change procedure of FIG. 10 in order to meet reflection criteria. In order to improve the situation, the component 658 can be moved in a direction out of the reflection zone 656, or the occupant may be moved to change the location of the reflection zone 656 so that is does not encompass the component 658.

Figure 21:
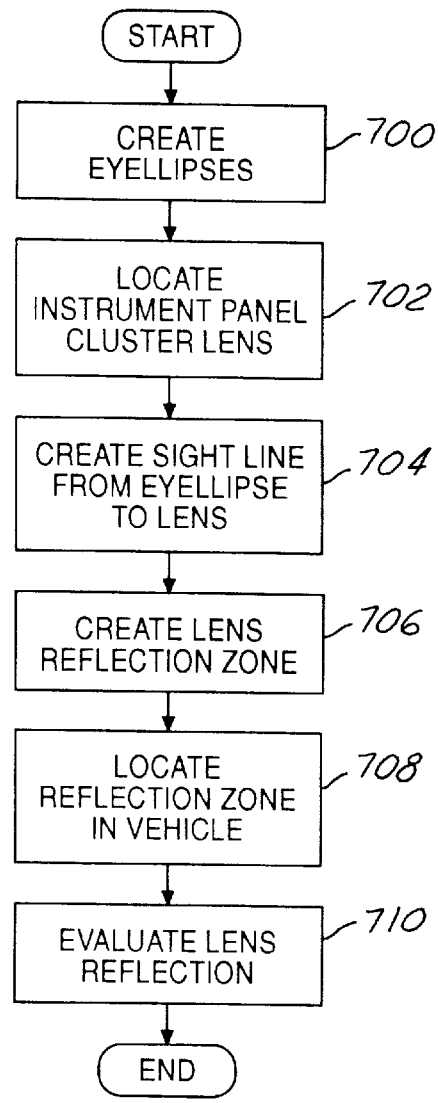
FIG. 21 is a flowchart showing creation of an instrument panel cluster lens reflection zone for use in a human factors reflection study according to an embodiment of the present invention.
Figure 22A:
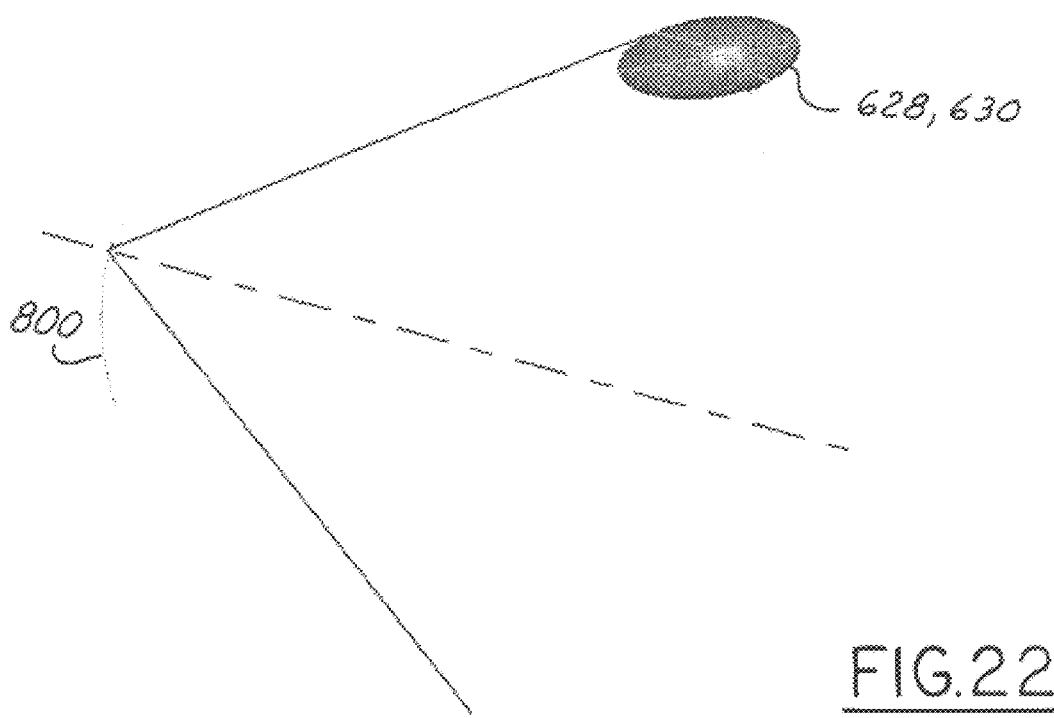
FIG. 22A is a side view of an eyellipse have a ray emanating therefrom onto an instrument panel cluster lens and reflecting therefrom.
Figure 22B:
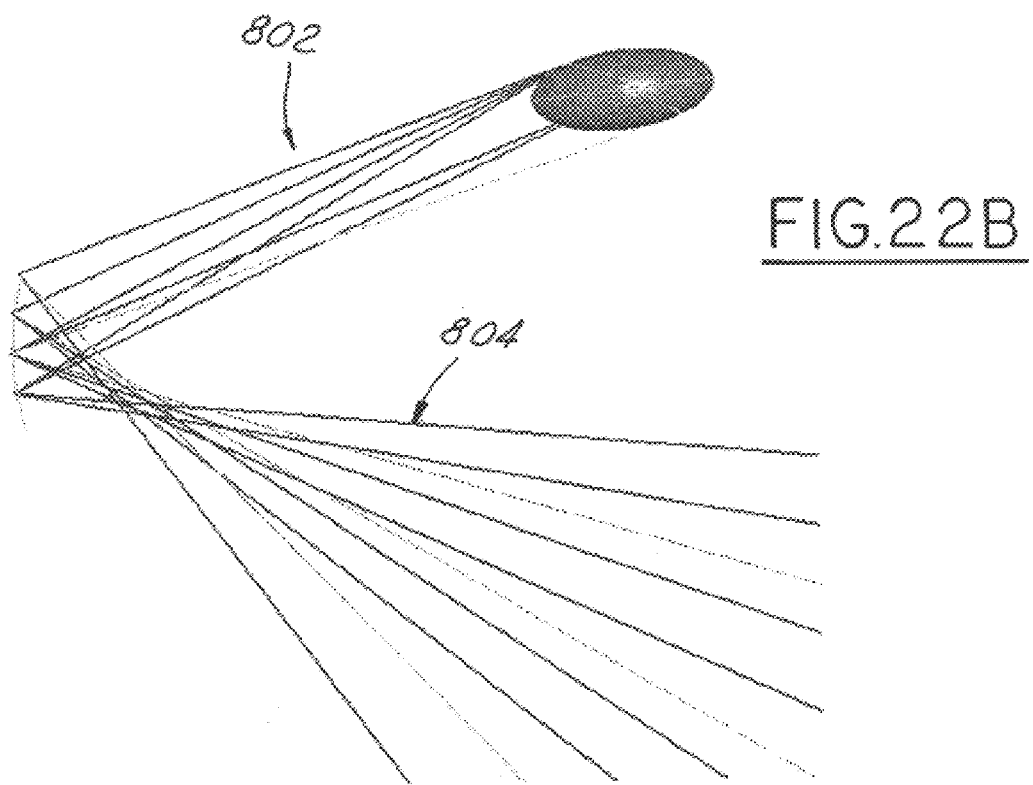
FIG. 22B is a side view similar to FIG. 22A but showing a series of rays emanating from the eyellipse and reflecting from the instrument panel cluster lens.
Figure 23A:
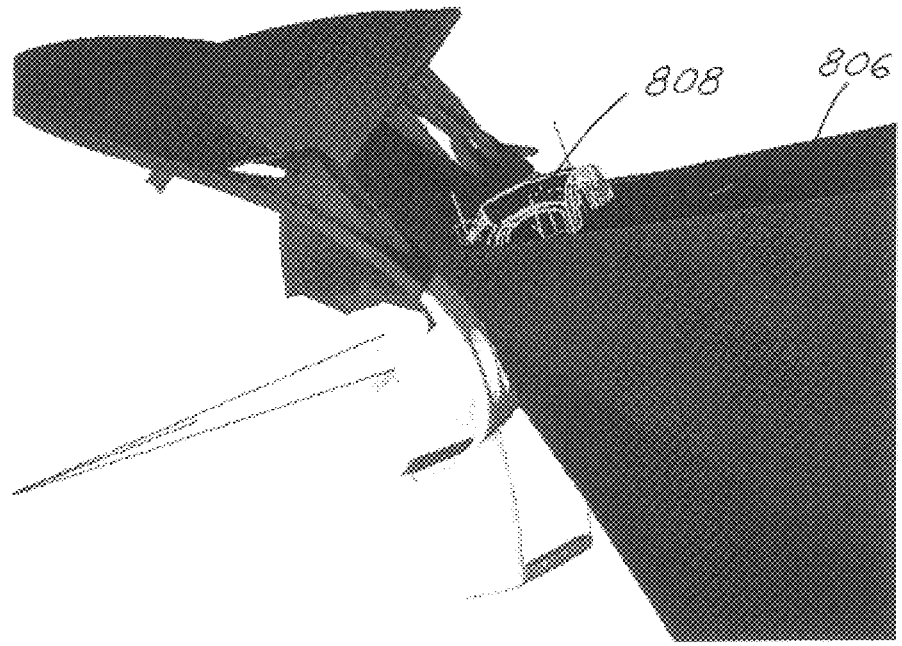
FIG. 23A is a perspective color view showing an instrument panel cluster reflection zone located in a vehicle in which the steering column shroud will be reflected onto the cluster lens.
Figure 23B:
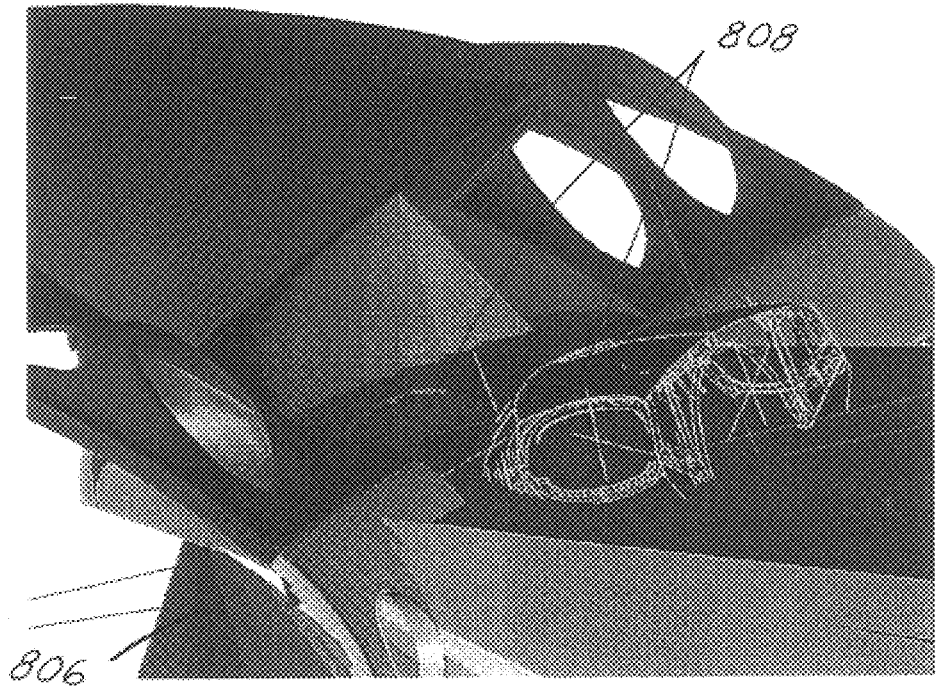
FIG. 23B is a perspective color view similar to FIG. 23A but showing an instrument panel cluster reflection zone modified by changing the shape of the cluster lens so that the steering wheel shroud is not in the reflection zone.

Turning now to FIG. 21, a method for performing an instrument panel cluster lens reflection study is shown. Beginning in box 700 (FIG. 21), eyellipses 628, 630 (FIG. 22A) are created and located as described above with reference to FIGS. 14A–16B. In box 702 (FIG. 21), an instrument panel cluster lens 800 (FIG. 22A) is located. Next, sight lines 802 (FIG. 22B) are created from the eyellipses 628, 630 to the lens 800 (box 704, FIG. 21). As seen in FIG. 22B, the sight lines 802 extend from various locations of the eyellipses 628, 630 so as to cover the entire curvature of the lens 800. A smaller area of the lens may also be covered with the rays. Reflection lines 804 (FIG. 22B) are then created, preferably using the angle of incidence equals the angle of reflection theory, and a reflection zone is created (box 706, FIG. 21) using the reflection lines 804. The reflection zone 806 is a three-dimensional consolidation of the reflection lines 804. The reflection zone 806 (maroon, FIG. 23A) is then located in a vehicle (box 708, FIG. 21), and lens reflection is evaluated (box 710, FIG. 21). If a vehicle component, such as the steering column shroud 808 (purple, FIG. 23A) is encapsulate, even partially, in the reflection zone 806, there will likely be a reflection of that component from the instrument panel cluster lens into the occupant's eyes. A vehicle designer may desire to remedy the situation using the design change procedure of FIG. 10 in order to meet occupant reflection reception criteria. In order to improve the situation, the steering column shroud 808 can be moved in a direction out of the reflection zone 806, the occupant may be moved to change the location of the reflection zone 806 so that is does not encompass the shroud 808, or the shape of the lens 800 may be modified to change the location of the reflection zone 806 as seen in FIG. 23B so that the shroud 808 no longer reflects into the occupant's eyes.

The method and system of the present invention may be used for a wide variety of occupant reflection reception related tasks and is not limited to that shown in FIGS. 2–23B. For example, rear view mirror reflection may be determined, and occupant A, B, and C visions zones can be generated. The present invention is meant to encompass a vehicle design method and system in a computer environment for allowing a vehicle designer to determine occupant reflection reception between computer electronic representations of the occupant and the vehicle, or systems on the vehicle, and to report the outcome of such a study to the vehicle designer.

As seen in the foregoing list, there are other human factors reflection studies which may be conducted to provide a vehicle designer with information for enhancing vehicle ergonomics. The present invention is not, of course, limited to those studies described above as the list is meant to be illustrative and not limiting.

While the form of the invention shown and described herein constitutes a preferred embodiment of the invention, it is not intended to illustrate all possible forms thereof. The words used are of description rather than limitation, and various changes may be made without departing from the spirit and scope of the invention as disclosed.

We claim:

1. A computer aided method for designing a portion of an automotive vehicle, the method comprising the steps of:

(a) storing in the memory of a computer system a first set of data representing an occupant position within the vehicle;

(b) storing in the memory a second set of data representing a position for at least one vehicle system;

(c) generating a third set of data representing a reflection interaction between the first set of data and the second set of data; and (d) comparing the third set of data to a fourth set of data representing a predetermined occupant reflection reception criteria.

2. A method for designing an automotive vehicle according to claim 1 wherein the first set of data includes data representing an occupant eye location.

3. A method for designing an automotive vehicle according to claim 1 wherein the second set of data includes data from an electronically stored parts library.

4. A method for designing an automotive vehicle according to claim 1 wherein the fourth set of data comprises human factors reflection data.

5. A method for designing an automotive vehicle according to claim 4 wherein the human factors data comprises data from at least one of a set of windshield reflection data and a set of instrument panel cluster lens reflection data.

6. A method for designing an automotive vehicle according to claim 1 wherein the second set of data is varied in step (e) based upon a predefined set of rules.

7. A method according to claim 6 wherein the predefined rules comprise a set of locational relationships between the first and second sets of data.

8. A method for designing an automotive vehicle according to claim 1 including the step of generating a fifth set of data representing at least one reflection surface based upon the third set of data representing a reflection interaction between the first set of data and the second set of data.

9. A method for designing an automotive vehicle according to claim 8 wherein the fifth set of data includes at least one of a windshield reflection surface and an instrument panel cluster lens reflection surface.

10. A method for designing an automotive vehicle according to claim 8 including the step of displaying the fifth set of data relative to the first and second sets of data.

11. A method for designing an automotive vehicle according to claim 8 wherein the fifth set of data is displayed so as to divide the passenger compartment into at least one of a windshield reflection zone and an instrument panel cluster lens reflection zone.

12. A method for designing an automotive vehicle according to claim 1 including the step of varying the second set of data until the third set of data meets the predetermined reflection criteria.

13. A computer aided method for designing a portion of an automotive vehicle, the method comprising the steps of:
    (a) storing in the memory of a computer system a first set of data representing an occupant position within the vehicle;
    (b) storing in the memory a second set of data representing a position for at least one vehicle system within the passenger compartment;
    (c) generating a third set of data representing a reflection relationship between the first set of data and the second set of data;
    (d) comparing the third set of data to a fourth set of data stored in the memory representing a predetermined reflection criteria; and
    (e) varying the second set of data until the third set of data meets the predetermined reflection criteria.

14. A system for designing a portion of an automotive vehicle, the system comprising:
    (a) first code means for representing an occupant position within a passenger compartment in the vehicle;
    (b) second code means for representing a position for at least one vehicle system within the passenger compartment;
    (c) third code means for generating a reflection relationship between the occupant position and the at least one vehicle system; and
    (d) fourth code means for comparing the reflection relationship to a predetermined reflection criteria.

15. A system according to claim 14 including fifth code means for varying the position of the at least one vehicle system or the occupant position.

16. A system according to claim 14 wherein the first code means includes code means for representing an occupant eye location.

17. A system according to claim 14 wherein the second code means includes code means for representing a parts library.

18. A system according to claim 14 wherein the predetermined reflection criteria comprises a set of human factors reflection data.

19. A system according to claim 18 wherein the human reflection factors data comprises data from at least one of a set of a set of windshield reflection data and a set of instrument panel cluster lens reflection data.

20. A system according to claim 15 wherein the fifth code means includes a set of locational rules between the first and second code means.

21. A system according to claim 15 including sixth code means for displaying the reflection relationship between the occupant position and the at least one vehicle system.

22. A system according to claim 21 wherein the sixth code means causes the reflection relationship between the occupant position and the at least one vehicle system to be displayed so as to divide the passenger compartment into at least one of a windshield reflection zone and an instrument panel cluster lens zone.

23. A computer aided vehicle design system for designing a portion of an automotive vehicle, the system comprising:
    (a) parameter selection code means for selecting a value for at least one occupant position parameter;
    (b) reflection code means for determining a reflection reflection interaction between at least one vehicle device and the at least one occupant position parameter;
    (c) comparison code means for comparing the reflection interaction to a predetermined criteria; and
    (d) adjustment code means for determining a locational change for the at least one vehicle device or the at least one occupant position parameter so that the reflection interaction meets the predetermined criteria.

24. A system according to claim 23 wherein the adjustment code means includes code means for varying a device location of the at least one vehicle device with respect to the at least one occupant position parameter based upon a set of predefined rules.

25. A system according to claim 24 wherein the predefined rules are defined by locational code means comprising a set of locational relationships between each of the at least one vehicle devices.

26. A system according to claim 25 wherein the locational code means comprises a standard parts library electronically stored in a computer memory.

27. A system according to claim 23 wherein the predetermined criteria are embodied in a human factors code means.

28. A system according to claim 27 wherein the human factors code means includes at least one of a set of windshield reflection code means and a set of instrument panel cluster lens reflection code means.

29. A system according to claim 23 including display means for displaying a geometric representation of the reflection interaction between the occupant representation and the at least one vehicle device.

30. A system according to claim 29 wherein the geometric representation is a surface which divides the passenger compartment into at least two zones.

31. A vehicle design system on a computer in which an occupant representation and at least one vehicle system have a common reference point, the system comprising:
    occupant representation means for orienting an occupant representation with respect to the common reference point in the computer;
    vehicle system representation means for representing in the computer at least one vehicle system with reference to the common reference point;
    interaction study means for performing at least one human factors interaction study between the occupant representation and the at least one vehicle system; and
    outcome communication means for reporting an outcome of the at least one human factors interaction study.

32. A vehicle design system on a computer having processor and a memory in which an occupant and at least one vehicle system are electronically represented with respect to a common reference point in a three-dimensional representation of a portion of a vehicle, the system comprising:
    occupant representation code means for orienting an occupant representation with respect to the common reference point in the computer;
    vehicle system representation code means for representing the at least one vehicle system with reference to the common reference point;

reflection code means for causing the processor to perform at least one human factors reflection study between the occupant representation and the at least one vehicle system; and outcome communication code means for reporting an outcome of the at least one human factors reflection study.

33. A method for designing an automotive vehicle in a computer system in which a portion of a vehicle, an occupant representation, and at least one vehicle system are electronically represented, the method comprising the steps of:

(a) orienting the occupant representation within a passenger compartment in the vehicle;

(b) positioning the at least one vehicle system within the passenger compartment;

(c) generating at least one reflection surface based upon a predetermined reflection criteria; and (d) displaying said at least one reflection surface so as to divide the passenger compartment into at least two reflection zones.

34. A method for designing an automotive vehicle according to claim 33 wherein the occupant representation is oriented using a predefined set of occupant orientation parameters.

35. A method for designing an automotive vehicle according to claim 34 wherein the predefined set of occupant orientation parameters include an occupant eye location parameter.

36. A method for designing an automotive vehicle according to claim 33 wherein the at least one vehicle system is defined in an electronically stored parts library.

37. A method for designing an automotive vehicle according to claim 33 wherein the predetermined reflection criteria comprise a set of human reflection factors.

38. A method for designing an automotive vehicle according to claim 37 wherein the set of human reflection factors comprise at least one of a set of windshield reflection data and an instrument panel cluster lens reflection data.

39. A method for designing an automotive vehicle according to claim 33 wherein the at least one reflection surface comprises at least one of a windshield reflection surface and an instrument panel cluster lens reflection surface.

40. A method for designing an automotive vehicle according to claim 33 wherein the at least one reflection zone comprises at least one of a windshield reflection zone and an instrument panel cluster lens reflection zone.

41. A method for designing an automotive vehicle according to claim 33 and further including the step of repositioning the at least one vehicle system within the passenger compartment after step (d) based upon a predefined set of rules.

42. A method according to claim 41 wherein the predefined rules comprise a set of locational relationships between each of the at least one vehicle systems and adjacent vehicle systems and the portion of the vehicle electronically represented.

43. A computer aided method for designing a portion of an interior of an automotive vehicle in which an occupant position and at least one vehicle device are electronically represented, the method comprising the steps of:

(a) selecting a value for the at least one occupant position parameter;

(b) determining a reflection relationship between the at least one occupant position parameter and the at least one vehicle device;

(c) comparing the reflection relationship to a predetermined criteria; and (d) determining a locational change between the occupant position parameter and the at least one vehicle device so that the reflection relationship meets the predetermined criteria.

44. A method for designing an automotive vehicle according to claim 43 wherein the occupant parameters includes an occupant eye location parameter.

45. A method for designing an automotive vehicle according to claim 43 wherein the at least one vehicle device is defined in an electronically stored parts library.

46. A method for designing an automotive vehicle according to claim 43 wherein the predetermined criteria comprise a set of human reflection factors including at least one of a set of windshield reflection data and a set of instrument panel cluster lens reflection data.

47. A method for designing an automotive vehicle according to claim 43 and further including the step of repositioning the at least one vehicle device within the interior based upon the locational change.

48. A method for designing an automotive vehicle according to claim 47 wherein the locational change is partially determined by a set of locational relationships between each of the at least one vehicle device, adjacent vehicle devices, and the interior portion of the vehicle.

49. A computer aided method for designing an interior portion of an automotive vehicle, the method comprising the steps of:

(a) selecting a set of generic parameters for describing an occupant position in the interior portion of the vehicle and occupant reflection interaction with respect to at least one device within the vehicle;

(b) selecting a value for each of the set of generic parameters;

(c) generating a reflection relationship between the occupant position and the at least one occupant device; and (d) determining a parameter change for at least one of the set of generic parameters so that the reflection relationship meets a predetermined criteria.

50. A method for designing an automotive vehicle according to claim 49 and further including the steps of generating and displaying at least one occupant-to-vehicle reflection surface based upon the reflection relationship so as to divide the passenger compartment into a plurality of reflection zones.

51. A method for vehicle design on a computer having processor and a memory in which an occupant and at least one vehicle system are electronically represented with respect to a common reference point in a three-dimensional representation of a portion of a vehicle, the method comprising the steps of:

orienting an occupant representation with respect to the common reference point in the computer;

representing the at least one vehicle system with reference to the common reference point;

determining at least one reflection interaction between the occupant representation and the at least one vehicle system; and reporting the at least one reflection interaction.

52. A method according to claim 51 wherein the occupant reflection interaction is determined based on a set of human factors reflection criteria.

53. A method for designing an automotive vehicle according to claim 52 wherein the set of human factors reflection criteria comprise at least one a windshield reflection criteria and an instrument panel cluster lens reflection criteria.

54. A method according to claim 51 wherein the occupant reflection interaction is reported by displaying a geometric representation of the reflection from the at least one vehicle device to the occupant representation.

55. A method according to claim 54 wherein the geometric representation is a surface which divides the passenger compartment into at least two reflection zones.

56. A method according to claim 51 including the step of rendering a three-dimensional surface for the occupant reflection representation, each of the at least one vehicle devices, and the portion of the vehicle.

57. A method according to claim 51 including the step of animating movement of the occupant reflection representation, at least one vehicle device, and the portion of the vehicle.

58. A method according to claim 52 including the step of determining a locational change for the at least one vehicle device, the occupant representation, or both, so that the reflection interaction meets the predetermined reflection criteria.

59. A method according to claim 58 including the step of varying a device location of the at least one vehicle device with respect to the common reference point so that the reflection interaction meets the predetermined reflection criteria.

60. A method according to claim 52 including the step of varying a device representation of the at least one vehicle device so that the reflection interaction meets the predetermined reflection criteria.

61. A method according to claim 60 wherein the device representation is selected from an electronically stored standard parts library.

62. A method according to claim 58 including the step of regenerating a vehicle design after making the locational change by changing at least one effected dimension of one of the at least one vehicle systems and the portion of the vehicle as required by the locational change.

63. A method according to claim 62 including the step of automatically selecting parts from an electronic parts library as a substitute for at least one vehicle system to meet a vehicle system change required by the locational change.

* * * * *